United States Patent
Prakash et al.

(10) Patent No.: US 12,424,295 B2
(45) Date of Patent: Sep. 23, 2025

(54) EVOLVING BAD BLOCK DETECTION IN NON-VOLATILE MEMORY

(71) Applicant: Sandisk Technologies, Inc., Milpitas, CA (US)

(72) Inventors: Abhijith Prakash, Milpitas, CA (US); Parth Amin, Livermore, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 63 days.

(21) Appl. No.: 18/360,520

(22) Filed: Jul. 27, 2023

(65) Prior Publication Data
US 2025/0006285 A1    Jan. 2, 2025

Related U.S. Application Data

(60) Provisional application No. 63/510,823, filed on Jun. 28, 2023.

(51) Int. Cl.
*G11C 29/12* (2006.01)
*G11C 29/02* (2006.01)
*G11C 29/36* (2006.01)

(52) U.S. Cl.
CPC ........ *G11C 29/022* (2013.01); *G11C 29/1201* (2013.01); *G11C 29/36* (2013.01); *G11C 2029/3602* (2013.01)

(58) Field of Classification Search
CPC ... G11C 29/022; G11C 29/1201; G11C 29/36; G11C 2029/3602
See application file for complete search history.

(56) References Cited

U.S. PATENT DOCUMENTS

| | | | |
|---|---|---|---|
| 7,970,985 B2 | 6/2011 | Gonzalez et al. | |
| 8,832,507 B2 | 9/2014 | Post et al. | |
| 8,902,657 B2 | 12/2014 | Iwai et al. | |
| 9,521,981 B2 | 12/2016 | Pachamuthu et al. | |
| 9,685,232 B2 | 6/2017 | Asaoka et al. | |
| 9,804,922 B2 | 10/2017 | Kochar et al. | |
| 10,803,970 B2 | 10/2020 | Schuh et al. | |
| 10,861,559 B1* | 12/2020 | Desai | G11C 16/12 |
| 10,923,196 B1* | 2/2021 | Rabkin | G11C 16/3445 |
| 11,545,230 B2 | 1/2023 | Chen et al. | |
| 12,148,478 B2* | 11/2024 | Yang | H10B 41/27 |
| 2014/0226414 A1* | 8/2014 | Costa | G11C 16/3445 365/185.22 |

(Continued)

*Primary Examiner* — Mohammed A Bashar
(74) *Attorney, Agent, or Firm* — Pearl Cohen Zedek Latzer Baratz LLP

(57) ABSTRACT

Technology is disclosed herein for detecting evolved bad blocks in three-dimensional NAND. The test may include a drain side erase that includes applying an erase voltage from the bit lines and a source side erase that includes applying an erase voltage from the source line(s). If the source side erase performed worse than the drain side erase this may indicate a defect near the source side of the block. For example, the source side erase may fail but the drain side erase may pass. As another example the source side erase may take at least a pre-determined number of additional erase pulses to pass than the drain side erase. If the block is found as having a defect the entire block could be marked bad or the defective region could be identified such that the defective region is no longer used.

17 Claims, 21 Drawing Sheets

(56) References Cited

U.S. PATENT DOCUMENTS

| | | | |
|---|---|---|---|
| 2017/0372789 A1* | 12/2017 | Ray | G11C 16/0483 |
| 2022/0101926 A1* | 3/2022 | Oowada | G11C 16/16 |
| 2022/0310161 A1 | 9/2022 | Pachamuthu et al. | |
| 2023/0395157 A1* | 12/2023 | Song | G11C 16/24 |
| 2024/0105265 A1* | 3/2024 | Yang | H10B 41/27 |

* cited by examiner

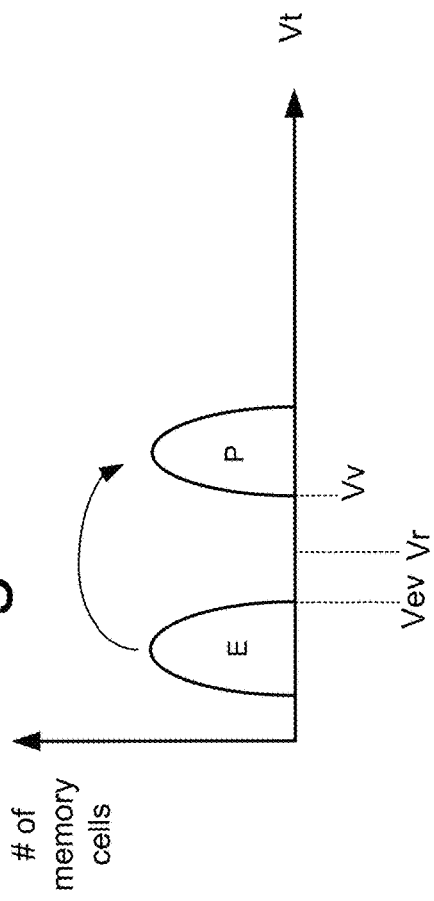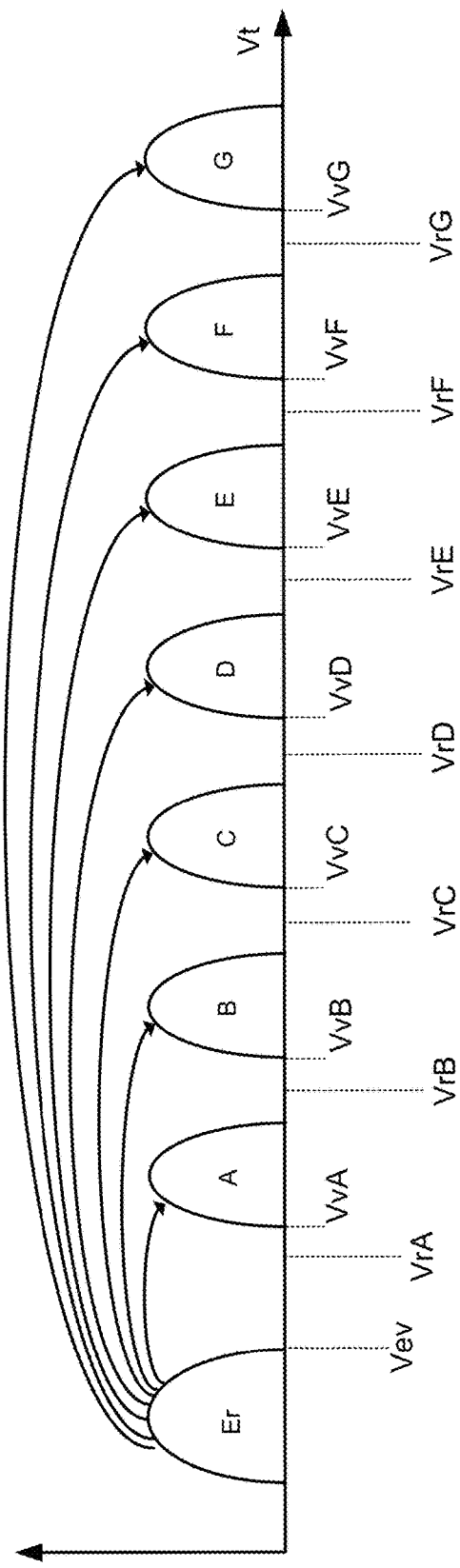

640

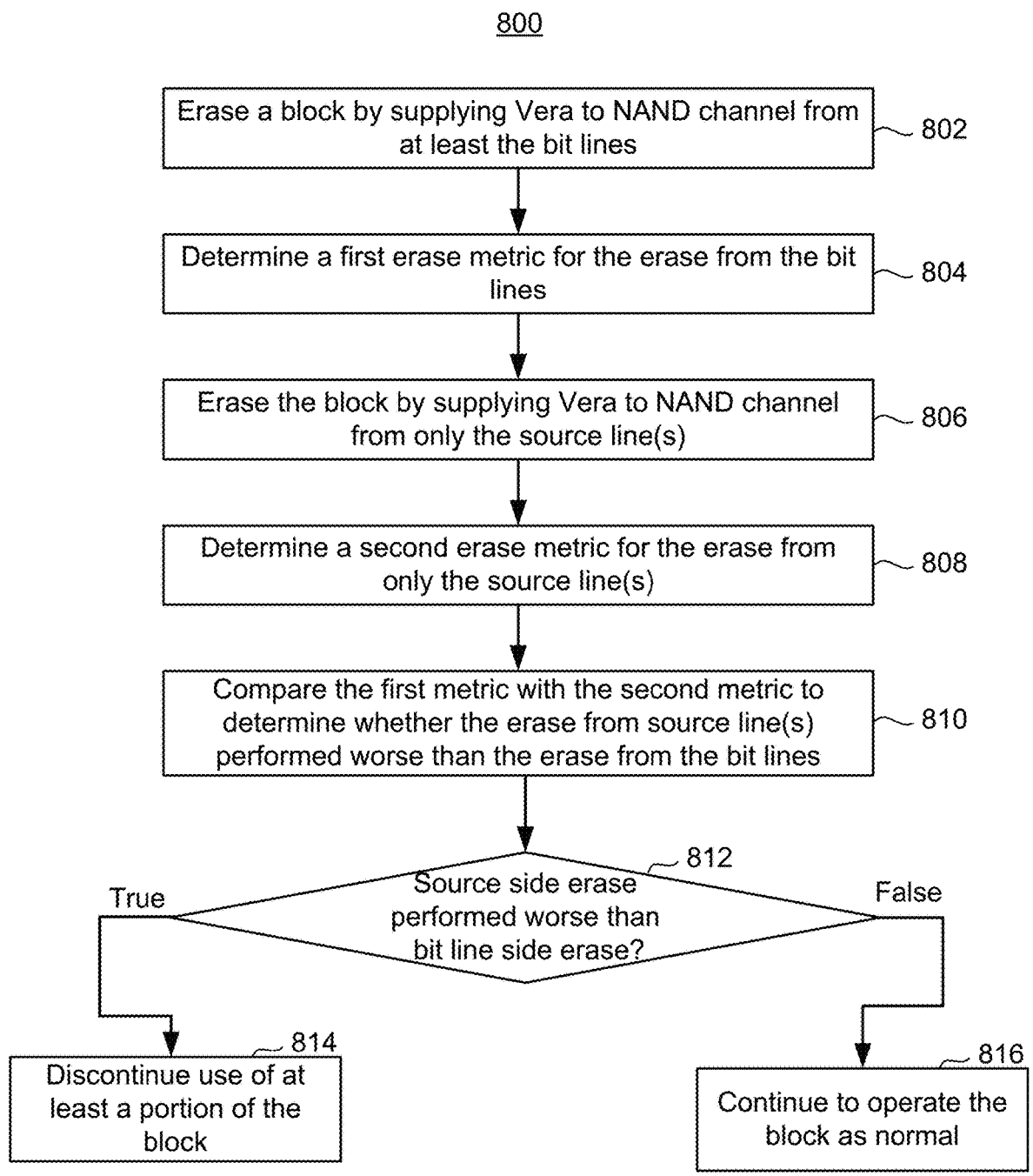

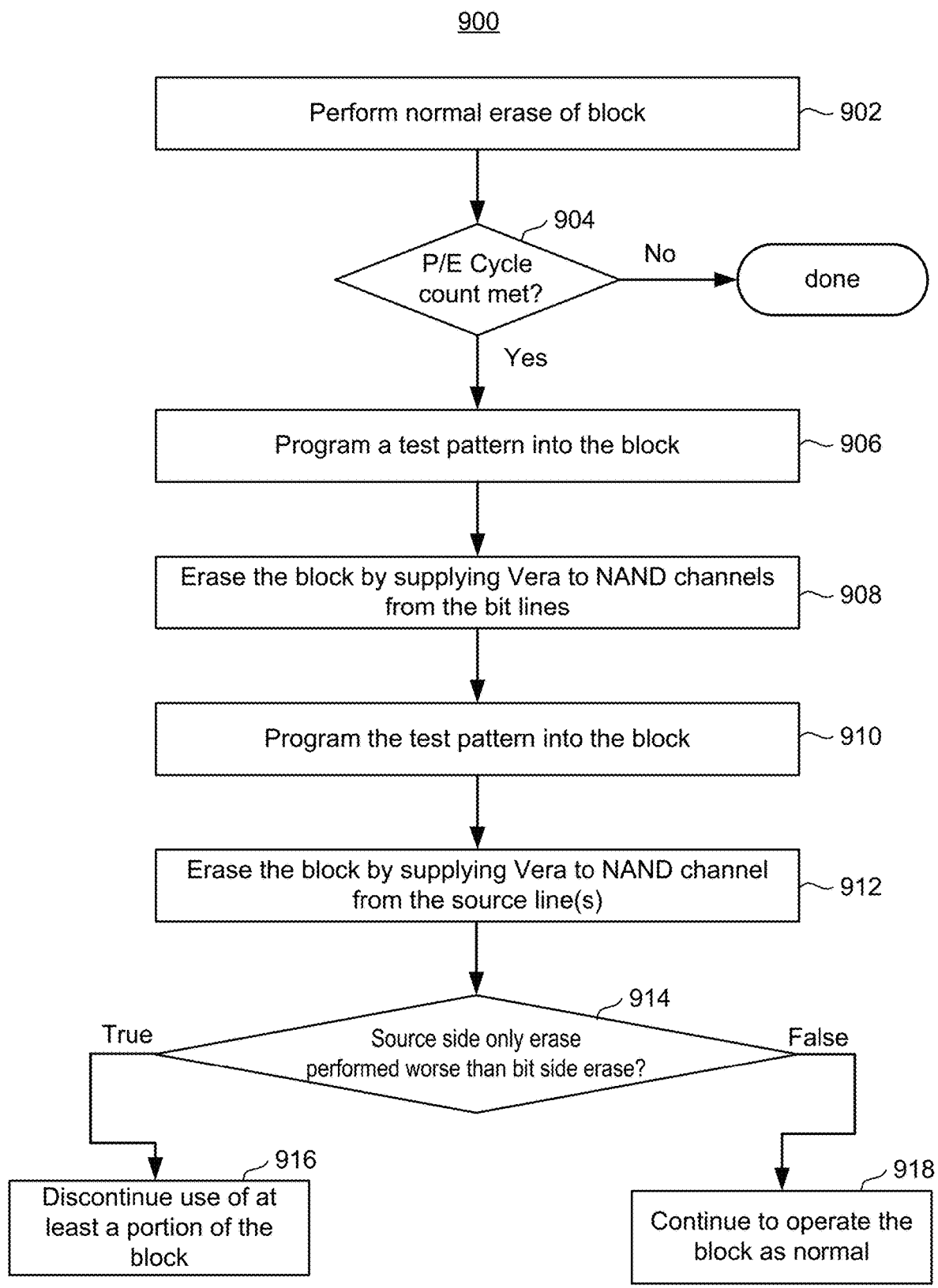

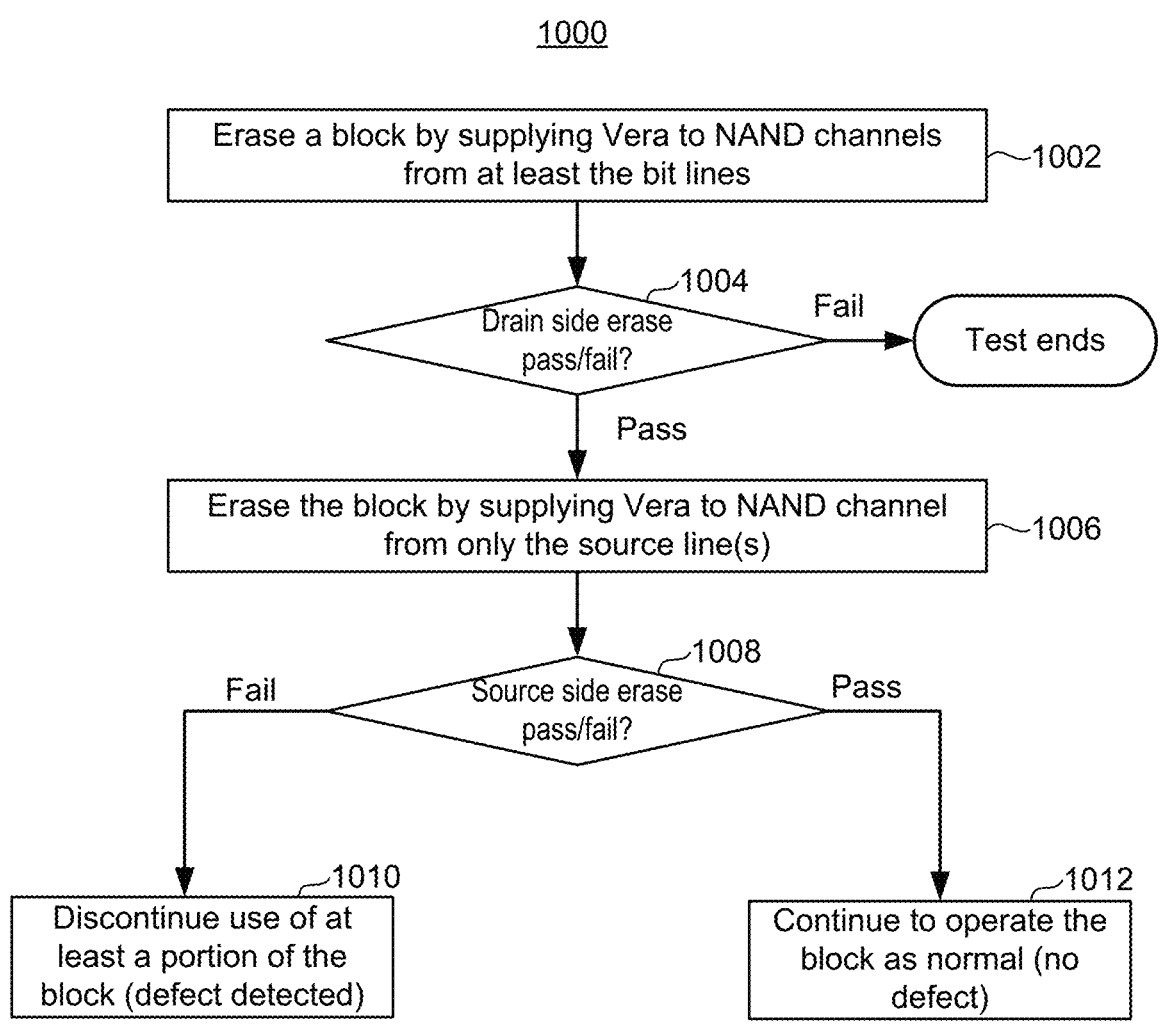

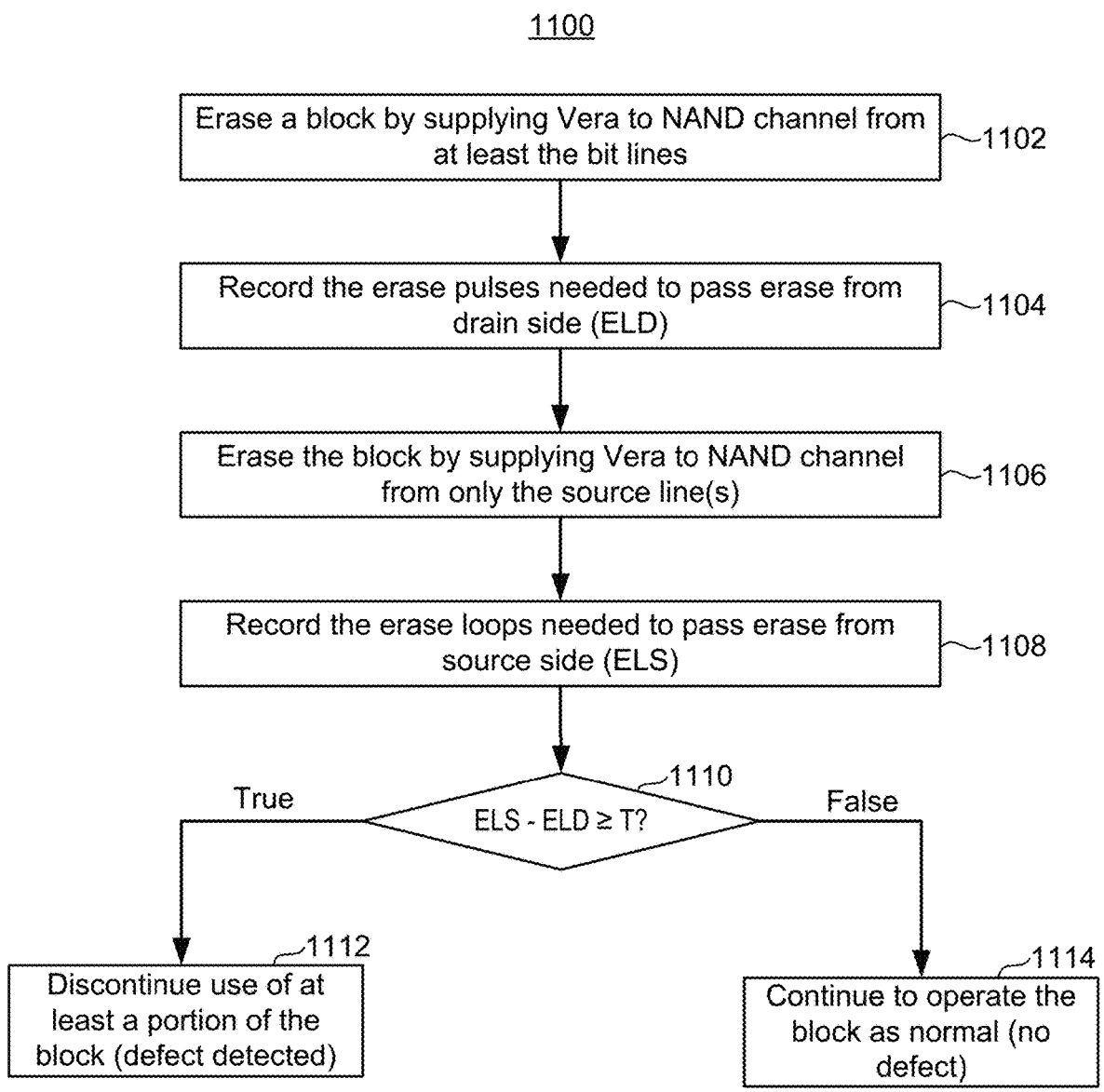

EVOLVING BAD BLOCK DETECTION IN NON-VOLATILE MEMORY

CLAIM OF PRIORITY

The present application claims priority from U.S. Provisional Patent Application No. 63/510,823, entitled "EVOLVING BAD BLOCK DETECTION IN NON-VOLATILE MEMORY," by Prakash et al., filed Jun. 28, 2023, incorporated by reference herein in its entirety.

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as physical blocks (or more briefly as "blocks"). For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The memory cells are programmed one group at a time. The unit of programming is typically referred to as a page. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

For memory such as NAND, a large set of memory cells are erased prior to programming. In some cases, the memory cells of an entire physical block are erased as a group. In some cases, the memory cells of a portion of a block are erased as a group. Erasing typically includes a number of erase loops, with each loop including applying an erase pulse and then verifying whether erase is complete. Typically, there is a limit to how many erase loops are permitted before the erase is considered to have failed.

One type of three-dimensional memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with layers of materials including a charge-trapping material to create a vertical column of memory cells (e.g., NAND string).

The semiconductor fabrication process may result in defects such as short circuits between word lines and memory cells. The memory device can be tested prior to being shipped to the customer in order to identify defects. Depending on the severity and type of the defect, a portion of the memory device such as a block can be marked as defective. The memory device is usually manufactured with more blocks than needed to meet storage requirements such that a number of blocks can be retired with the device still meeting storage requirements.

It is also possible for the memory device to develop a defect after it is shipped to the customer, which may be referred to as an evolved defect. Evolved defects are sometimes referred to as grown defects. Such evolved defects are sometimes due to a flaw in the semiconductor fabrication process that was not severe enough to be detected prior to shipping the device to the customer. Detecting evolved defects can be quite challenging, especially if the defect gradually becomes worse. Moreover, the time taken to test for such evolved defects must be considered to avoid impacting performance.

BRIEF DESCRIPTION OF THE DRAWINGS

Like-numbered elements refer to common components in the different figures.

FIGS. 5A and 5B depicts threshold voltage distributions.

FIG. 8 is a flowchart of one embodiment of a process of testing a group of NAND strings for an evolving defect at a source end.

FIG. 9 is a flowchart of one embodiment of a process of operating a block of NAND strings in connection with a normal erase.

FIG. 10 is a flowchart of one embodiment of a process of testing for a defect in which the determination of whether the source-side erase performed worse than the drain-side erase is based on pass/failure status.

FIG. 11 is a flowchart of one embodiment of a process of testing for a defect in which the determination of whether the source-side erase performed worse than the drain-side erase is based on a number or erase pulses needed to complete erase.

DETAILED DESCRIPTION

Technology is disclosed herein for a storage system that detects evolved bad blocks in three-dimensional NAND. An evolved bad block refers to a group of NAND strings, arranged as a block, that passed device qualifying initially but that at some point developed a defect that resulted in a test failure. In an embodiment, blocks are periodically tested such as on a schedule defined by program-erase cycles. An embodiment of the test includes a drain side erase that includes applying an erase voltage from the bit lines (drain side erase). The test includes a source side erase that includes applying an erase voltage from the source line(s) (source side erase). If the source side erase performed worse than the drain side erase this may indicate a defect near the source side of the block. In one embodiment, if the source side erase fails but the drain side erase passes, then the source side erase performed worse. In one embodiment, the system counts how many erase pulses it takes for the drain side erase to pass and how many pulses it takes for the source side erase to pass. The source side erase may be defined as performing worse than the drain side erase if the source side erase takes more erase pulses than the drain side erase to pass. There may also be a certain leeway built in such that worse performing is defined as taking some other number of extra erase pulses such as two, three, or some other number. If the block is found as having a defect, one option is to mark the block bad such that the block is no longer used. Another option is to identify a region in the source side of the block that is defective such that the defective source side region is no longer used, but functional regions of the block are still available for use. The foregoing test may be especially useful for detecting an evolved defect that impacts the source side of the block. On such example is a WL-MH short near the bottom (source side) of the block. However, the system could also detect an evolved defect in the drain side of the block.

Figure 1:
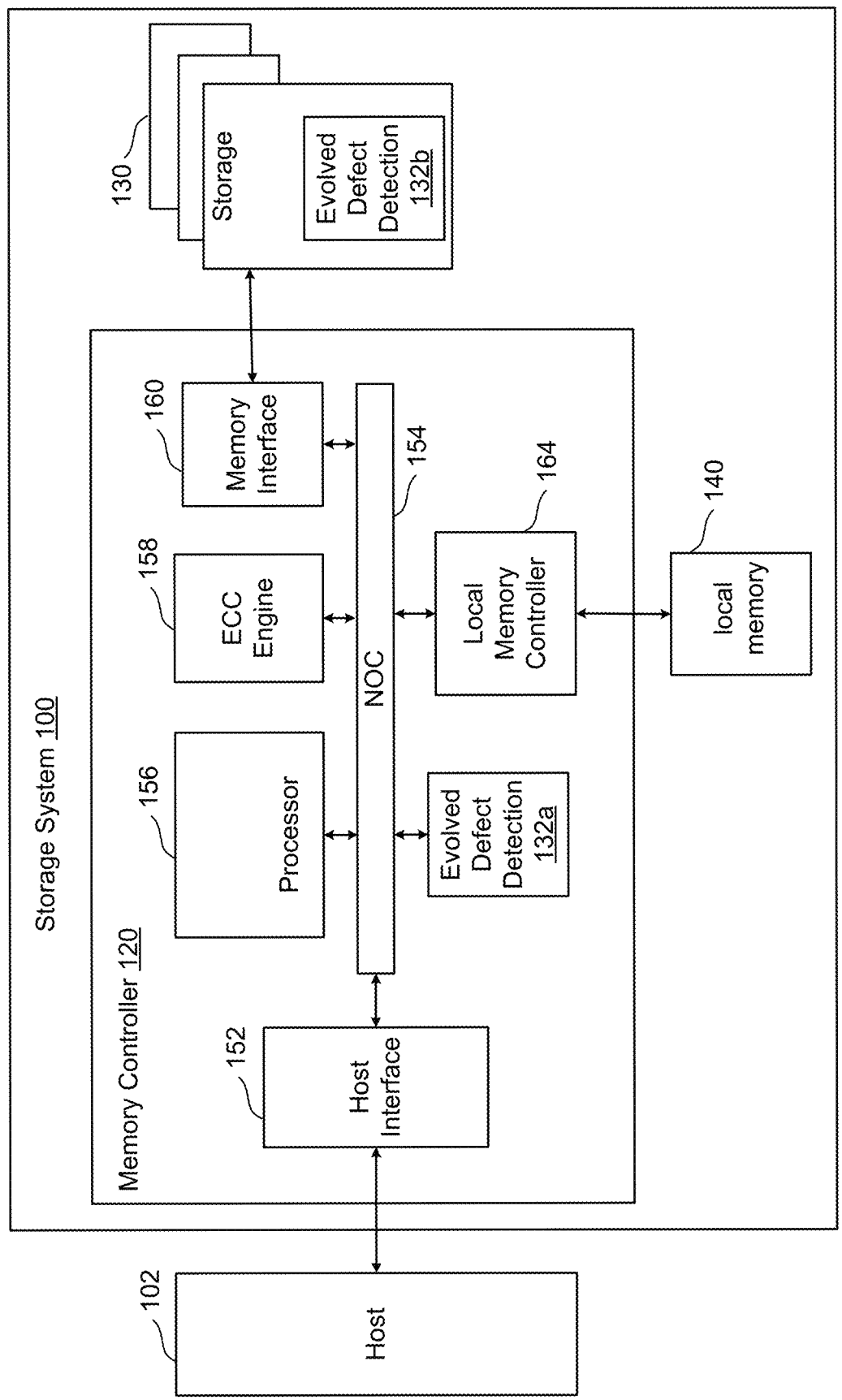
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

The storage system 100 has evolved defect detection 132, which is able to detect a defect that evolved in the storage 130. The evolved defect detection 132 may have a component 132a in the memory controller 120 and a component 132b in storage 130. In one embodiment, the evolved defect detection 132a in the memory controller 120 maintains a schedule of when to perform the test of a block for an evolved defect. The evolved defect detection 132a may instruct the storage 130 to perform various procedures such as erases, programming test patterns, etc. In one embodiment, the evolved defect detection 132b controls the test at the die level. For example, evolved defect detection 132b may control applying erase voltages and determining results of the erase. The results of the erase may be reported to the memory controller 120. In an embodiment, the evolved defect detection 132a may be implemented by processor 156. In an embodiment, the memory controller 120 contains a list of bad (or defective) blocks in storage 130. Evolved defect detection 132a may add blocks to that list.

Figure 2A:
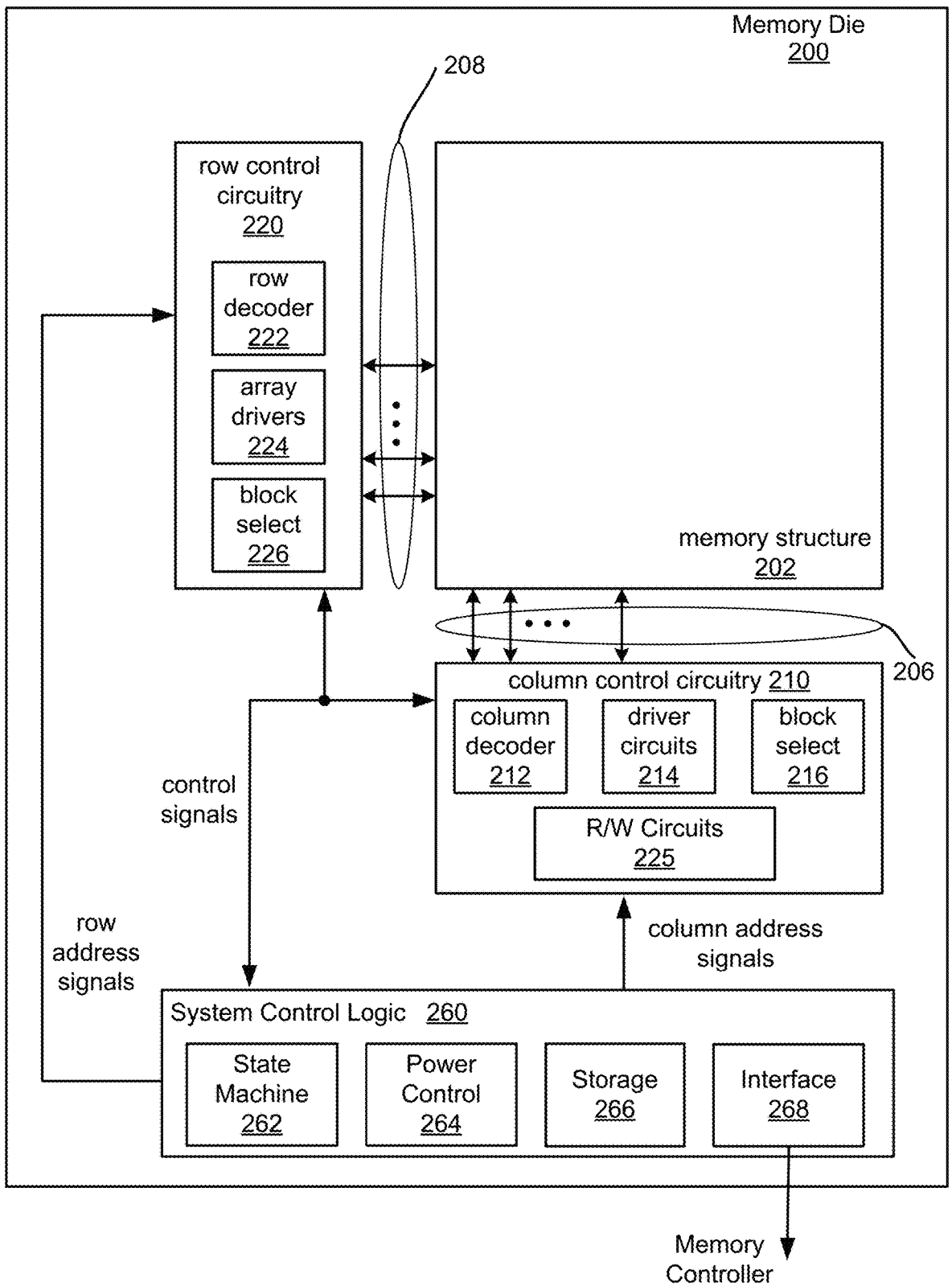
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuitry 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

In an embodiment, the system control logic 260 receives a command from memory controller 120 to test a block for an evolved defect. In an embodiment, various components on the die implement evolved defect detection 132b. For example, evolved defect detection 132b may be implemented by a combination of one or more of: state machine 262, power control 264, row control circuitry 220 and/or column control circuitry 210.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used. The commands may include one or more commands to execute an open block read in accordance with one or more embodiments described herein.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
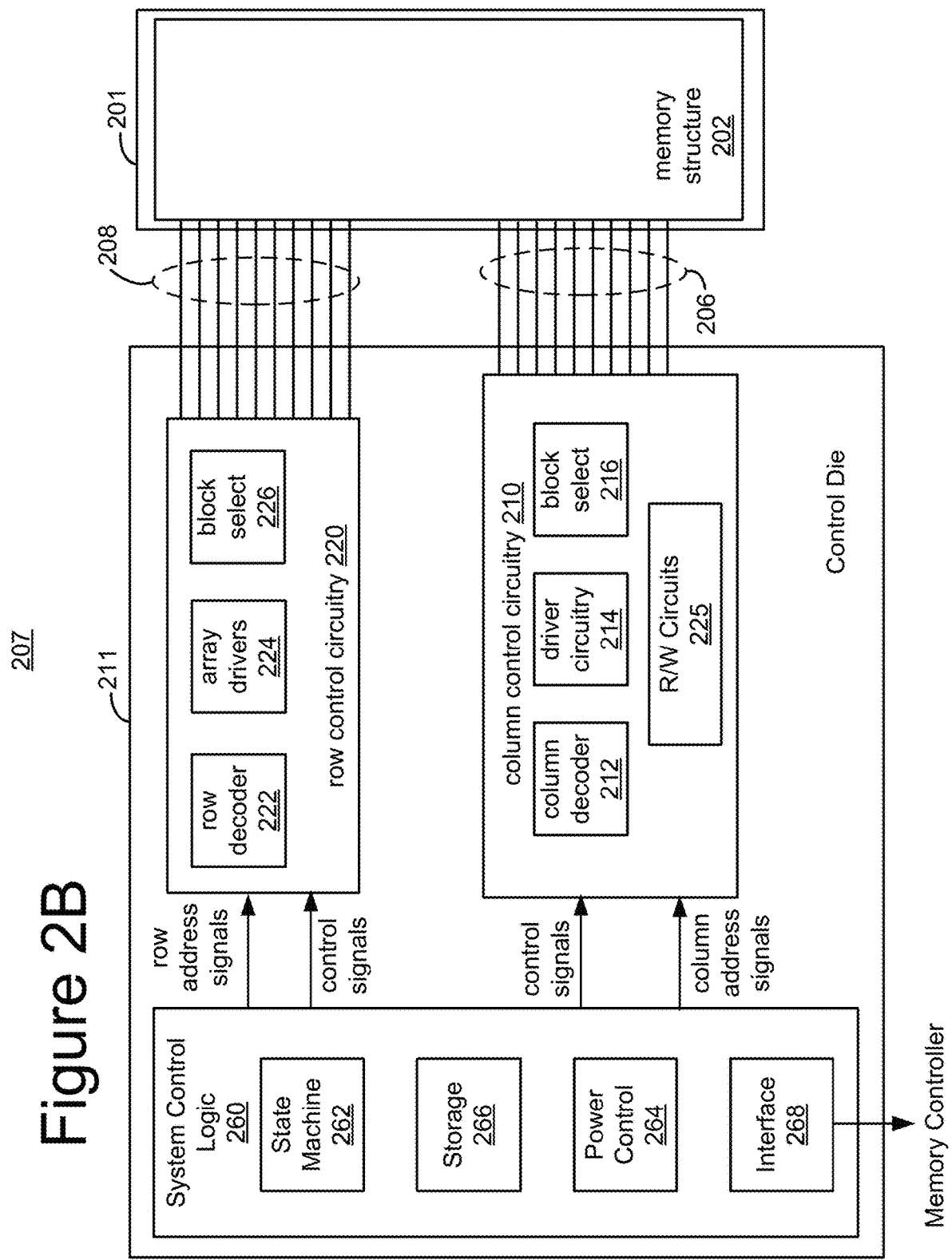
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, storage 130, memory die 200, integrated memory assembly 207, and/or control die 211.

Figure 3A:
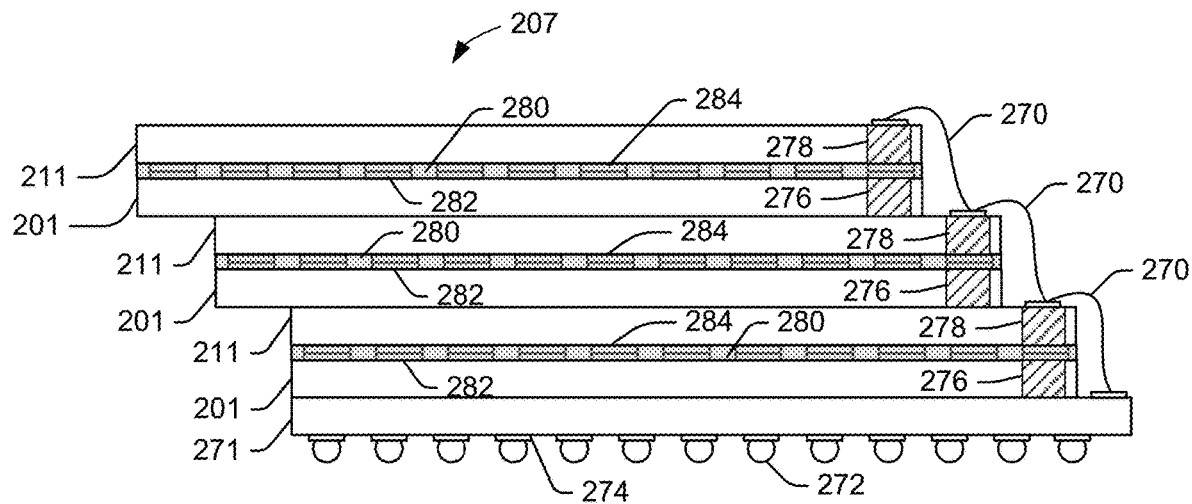
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
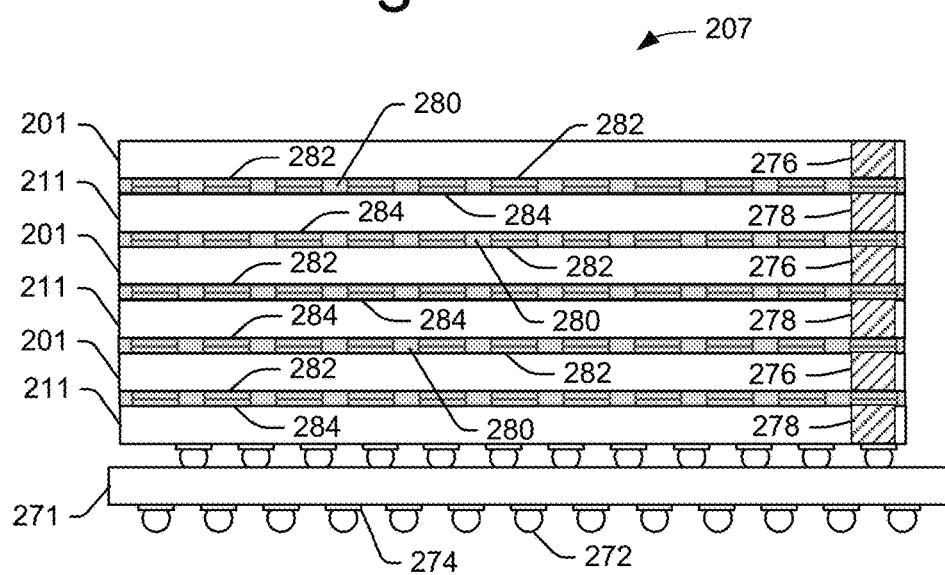

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
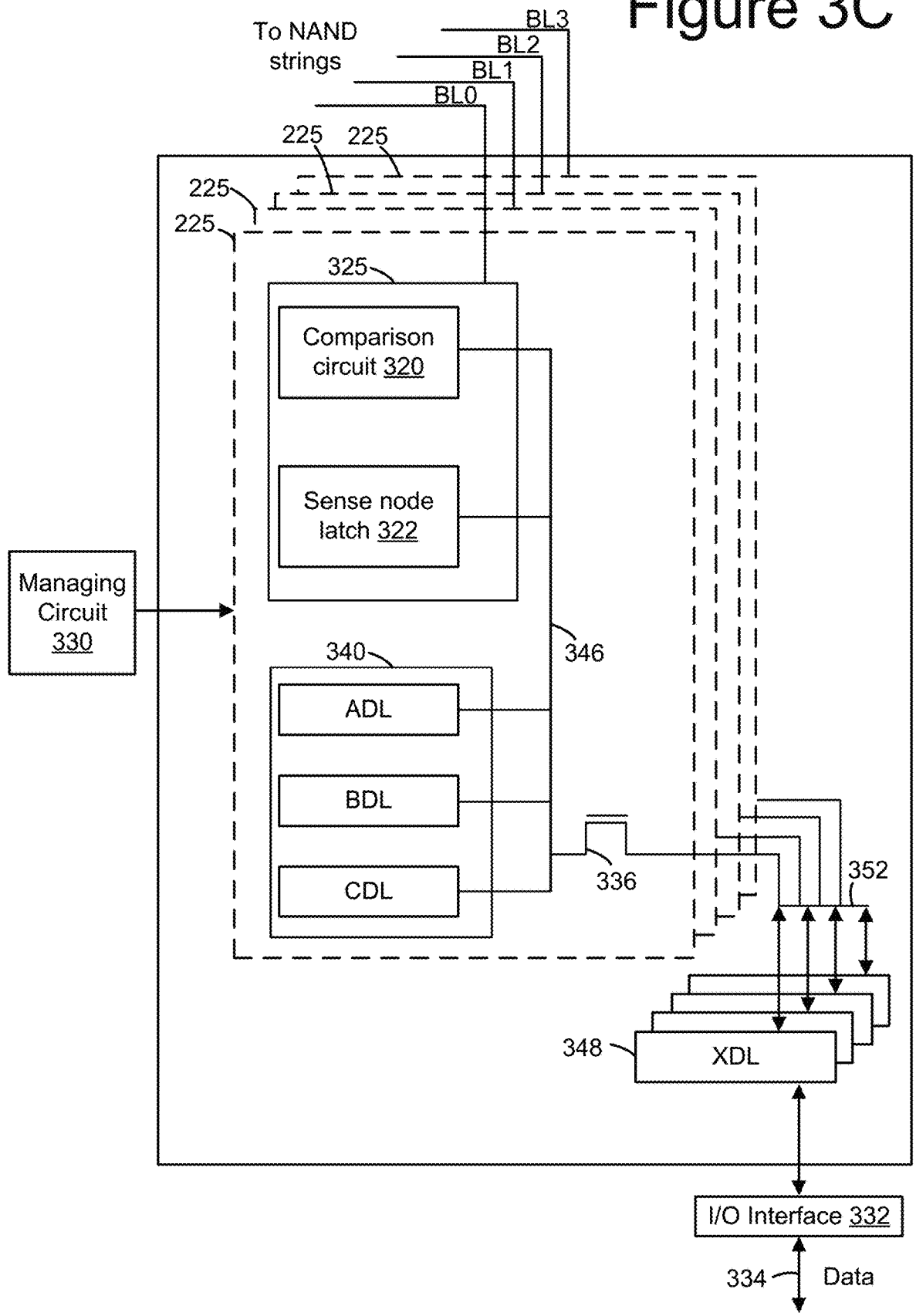
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
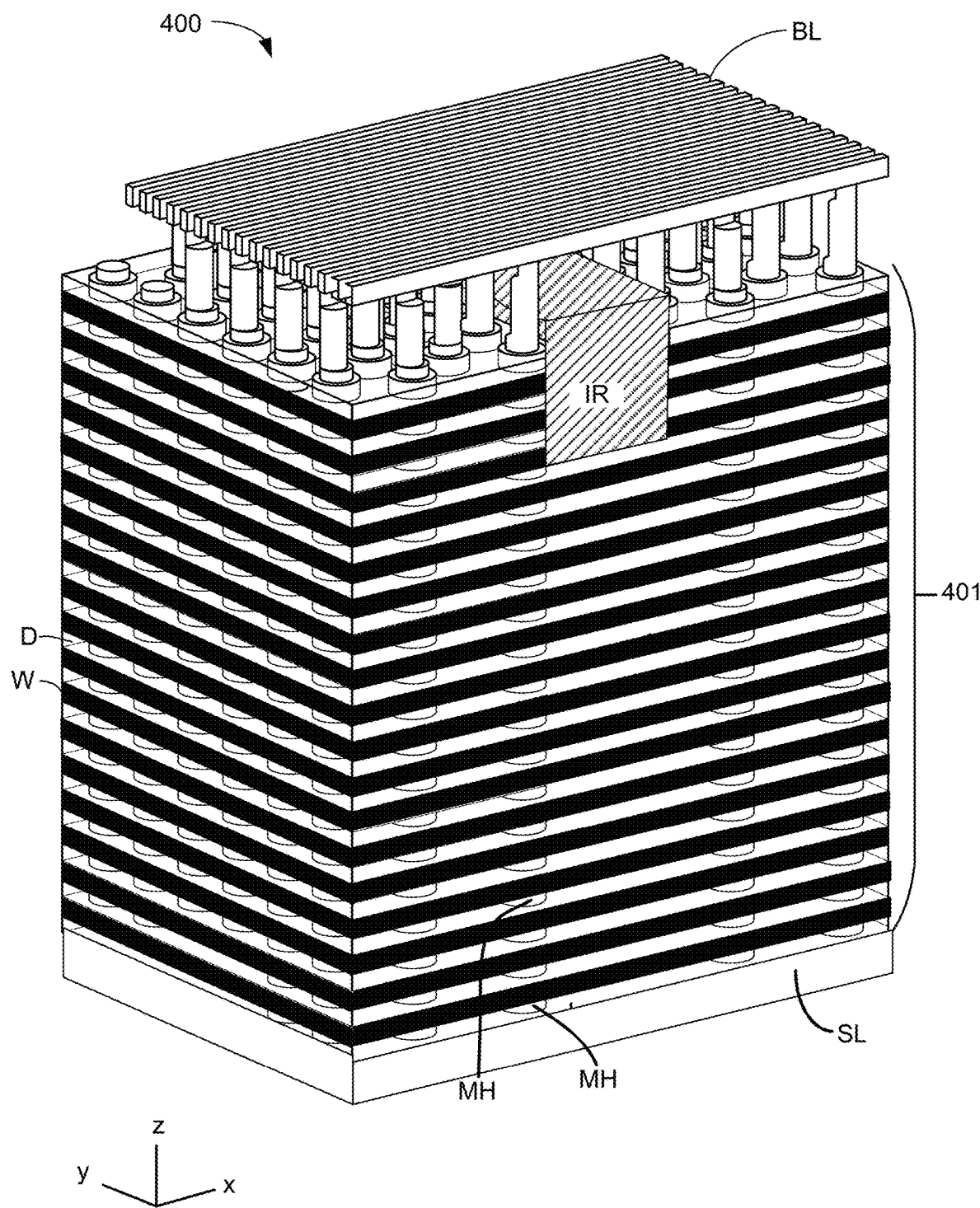
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
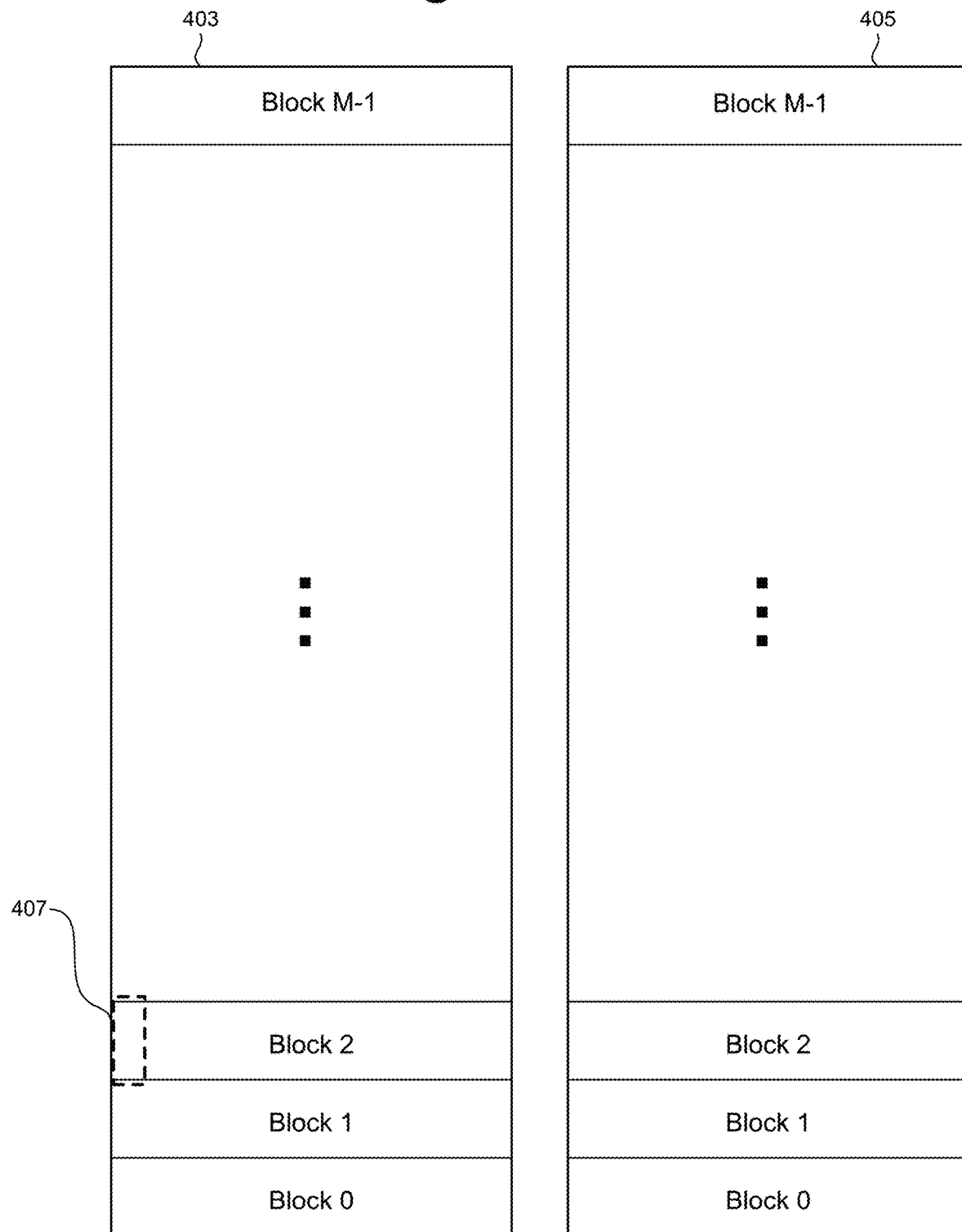
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks (or more briefly "blocks"). However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
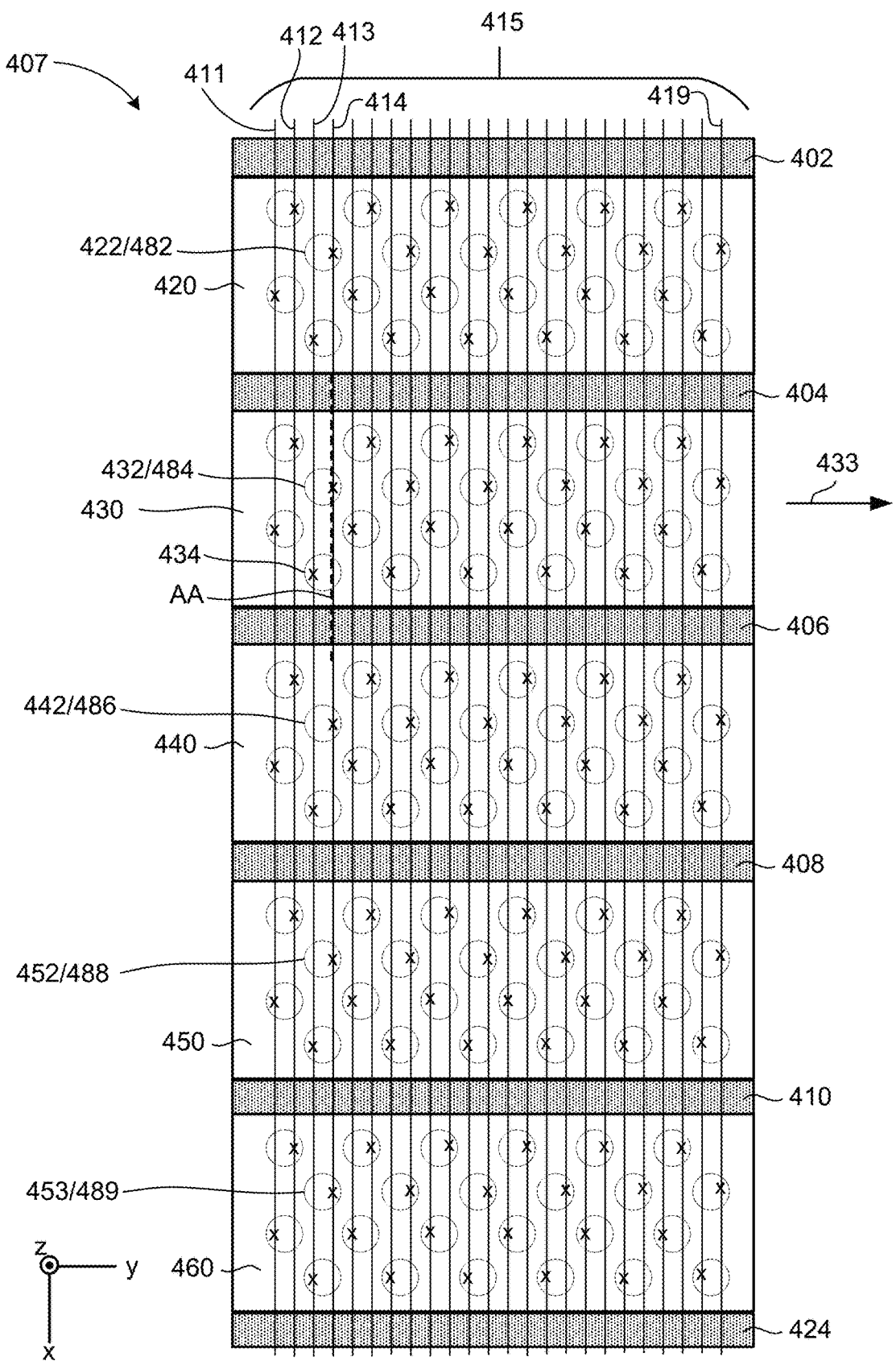
FIG. 4B is a block diagram depicting a top view of a portion of block of memory cells.

FIGS. 4B, 4C, 4D and 4F depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the physical block 407 from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, 408, or 410. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
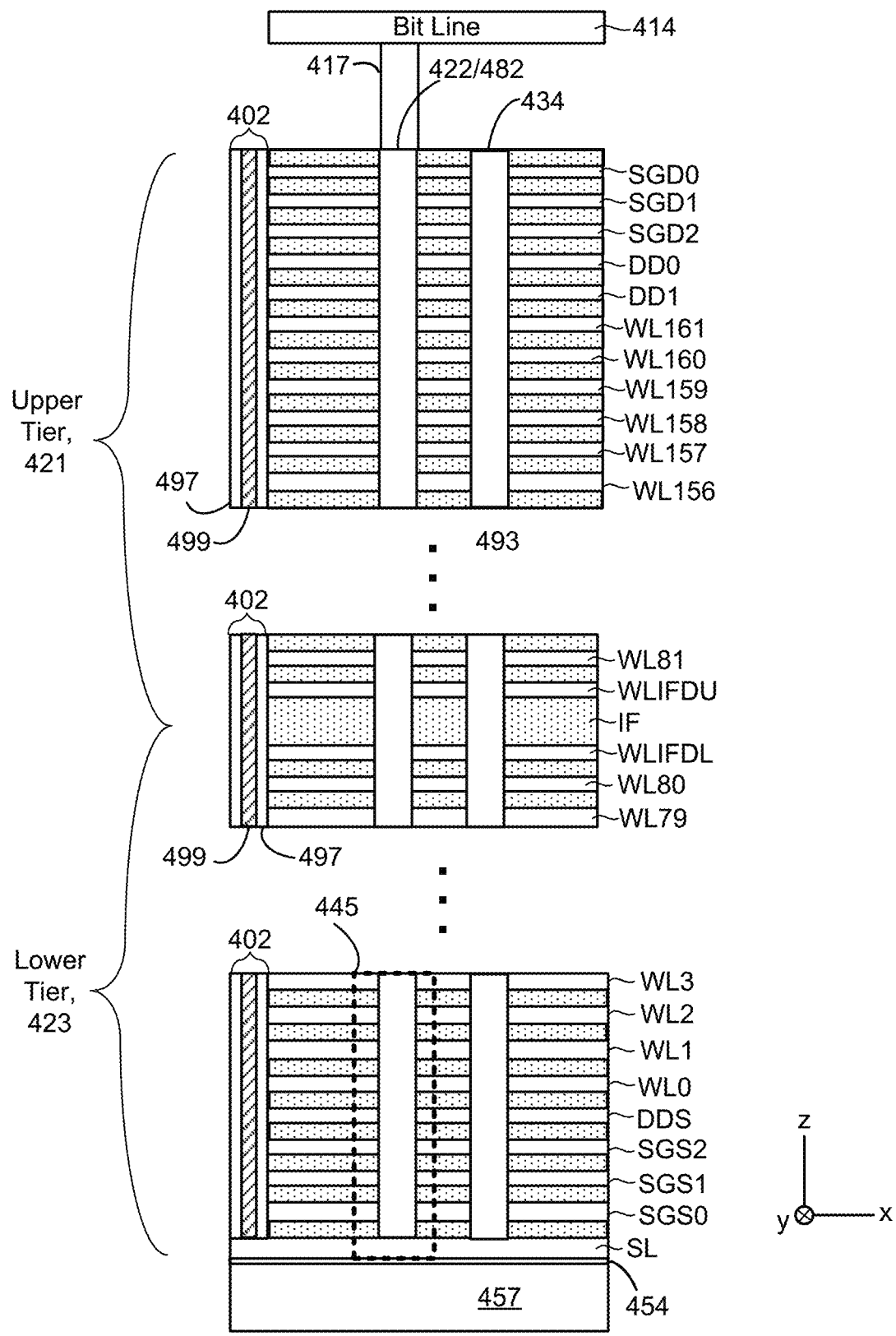
FIG. 4C depicts an embodiment of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

Along one side of the stack is an isolation trench 402 with a conductive region 499. The isolation trench 402 has an insulating material 497 on its outer walls. The insulating material 497 provides isolation between two blocks (see FIG. 4B). There may be a similar isolation trench 424 on the other side of the block (see FIG. 4B). The conductive region 499 electrically connects to the SL. Therefore, conductive region 499 may be used to provide operating voltages to the SL.

FIG. 4C depicts an example of a stack 435 having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Figure 4D:
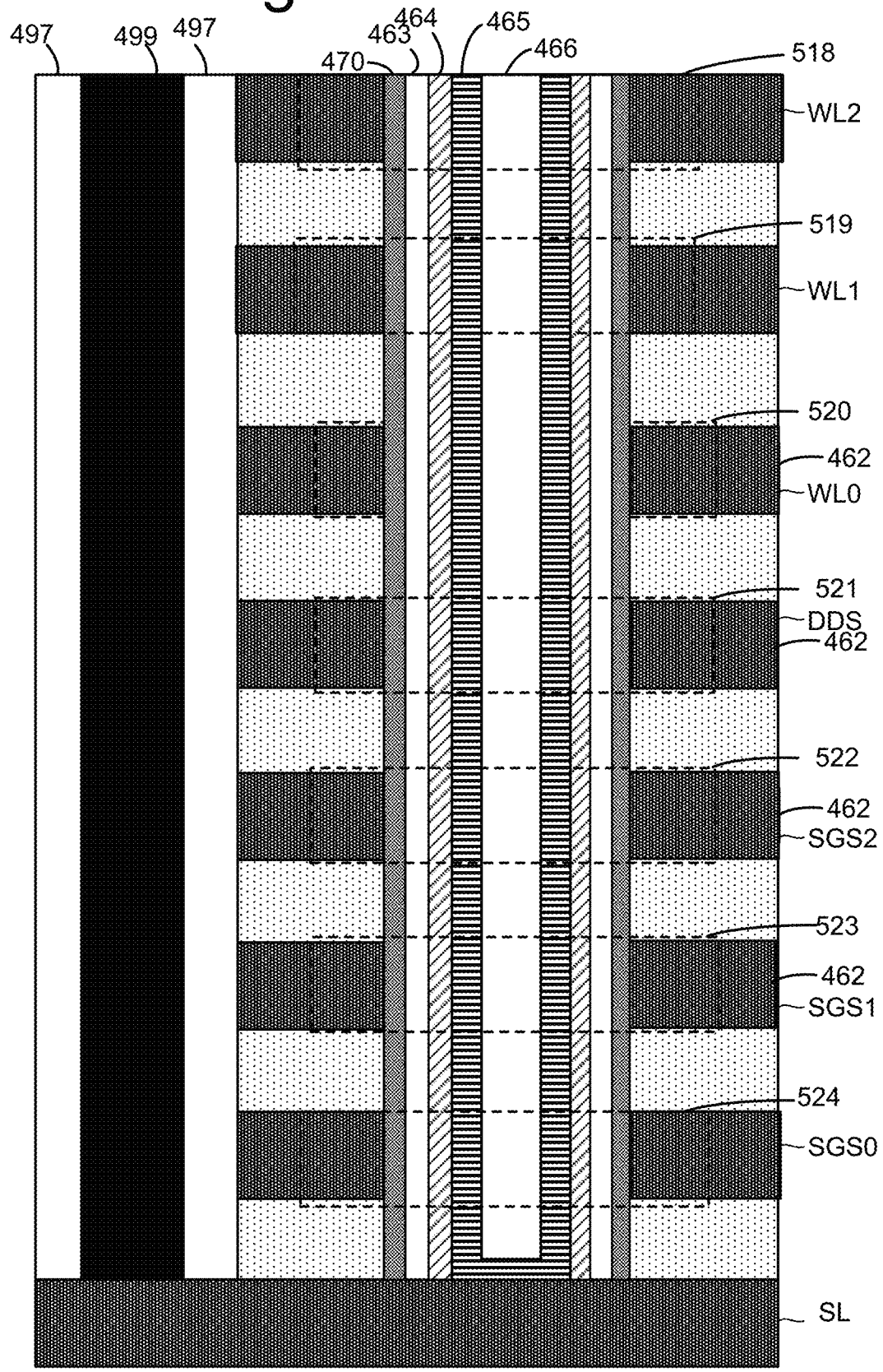
FIG. 4D depicts a view of region 445 of FIG. 4C.

FIG. 4D depicts a view of the region 445 of FIG. 4C. Data memory cell transistors 518, 519, 520 are indicated by the dashed lines. A dummy memory cell transistor 521 is indicated by the dashed lines. Also, SGS transistors 522, 523, 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

The isolation trench 402 depicted in FIGS. 4C and 4D is well-formed. However, it is possible for the isolation trench 402 to be angled such that it is not perfectly perpendicular to the substrate 457. This angling may be referred to as ST bending. If the isolation trench 402 angles too far, the lower portion of isolation trench 402 could contact a memory hole region. The ST bending could result in a latent defect that is not detected when the device is manufactured but evolves into a defect in the field.

Figure 4E:
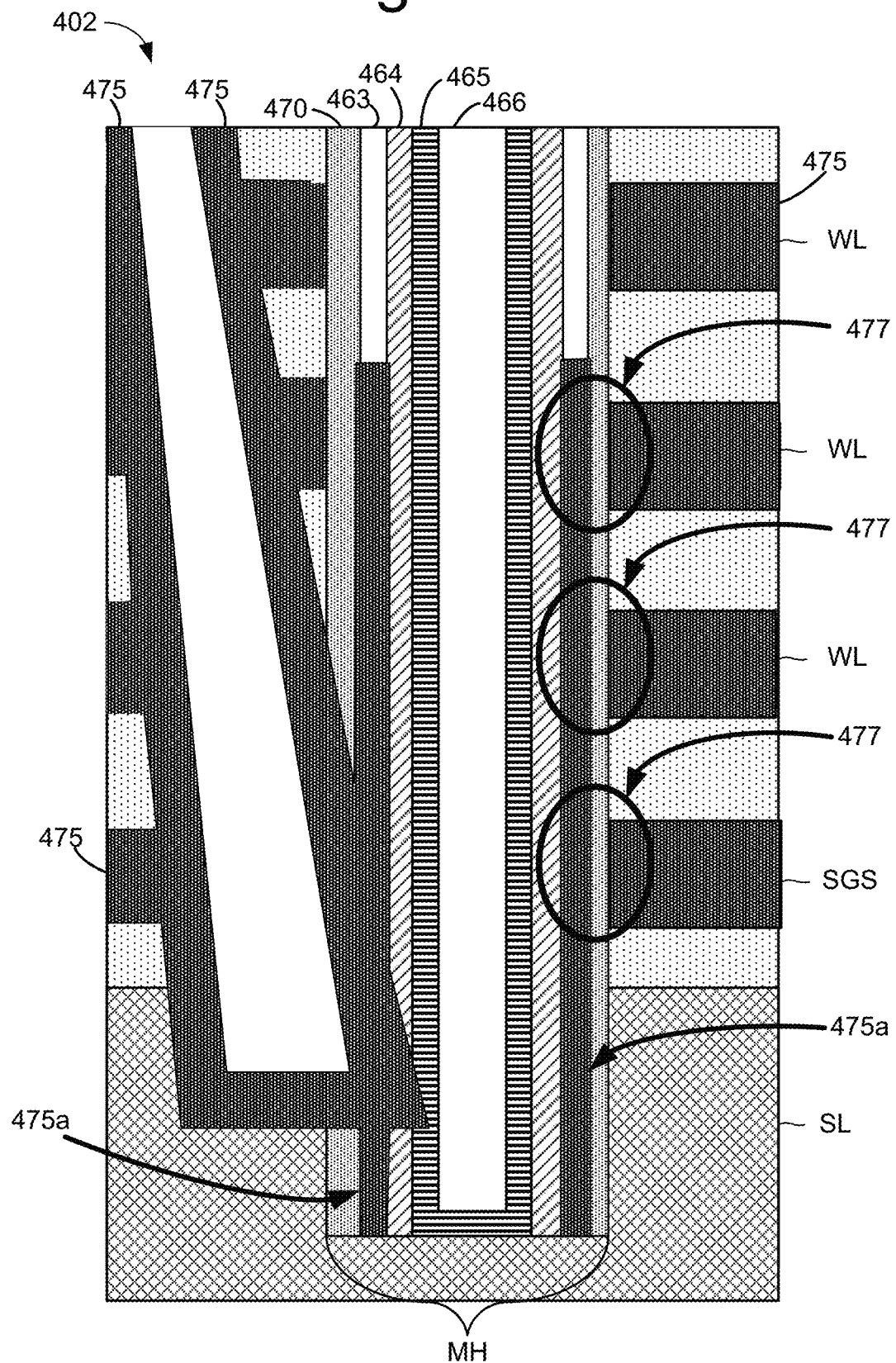
FIG. 4E depicts an example of ST bending.

FIG. 4E depicts an example of ST bending. The diagram shows a stage in one possible fabrication process. In one possible fabrication process the isolation trench is used to deliver Tungsten to the word line layers. FIG. 4E shows the stage in which Tungsten 475 has been deposited into the isolation trench 402. At this stage the Tungsten 475 is at the outer edges of the isolation trench 402. Moreover, the word line layers (WL, SGS) have been filled with Tungsten 475. The ST bending issue has resulted in the lower portion of the isolation trench 402 cutting into the lower portion of the memory hole (MH). Therefore, some of the Tungsten 475 that has been deposited into the isolation trench 402 has undesirably migrated into the memory hole (see Tungsten 475a). This Tungsten 475a in the memory hole MH could potentially result in leakage between the memory hole MH and the SGS and/or the lower word lines. The regions 477 points out some possible places where a short could occur between the Tungsten 475a in the memory hole MH and the Tungsten 475 in a WL layer. It is possible for there to be an evolving defect in which the leakage issue (or short circuit) becomes worse over time. Therefore, the defect might not be detected at manufacture. For example, the ST bending depicted in FIG. 4E may be relatively severs such that a short circuit might be detected at manufacture. However, a less sever case of ST bending may be more difficult to detect at manufacture. In an embodiment, an evolving defect involving ST bending is detected. Finally, as noted FIG. 4E depicts a stage of one possible fabrication process. A later stage may remove the Tungsten from the edge of the isolation trench 402 and then form a structure such as depicted in FIG. 4C or 4D. However, such later stages may be unable to remove the Tungsten that was undesirably migrated into the memory hole. Further details of one possible way for fabricating the ST trench 402 are described in U.S. Pat. No. 9,524,981, entitled "Three Dimensional Memory Device with Hybrid Source Electrode for Wafer Warpage Reduction," which is hereby incorporated by reference. It will be appreciated that there are other ways for fabricating the ST trench 402. Moreover, while one type of evolving defect that can be detected by techniques disclosed herein are defects that may result from ST bending, techniques disclosed herein are capable of detecting evolving defects that are due to issues other than ST bending.

Figure 4F:
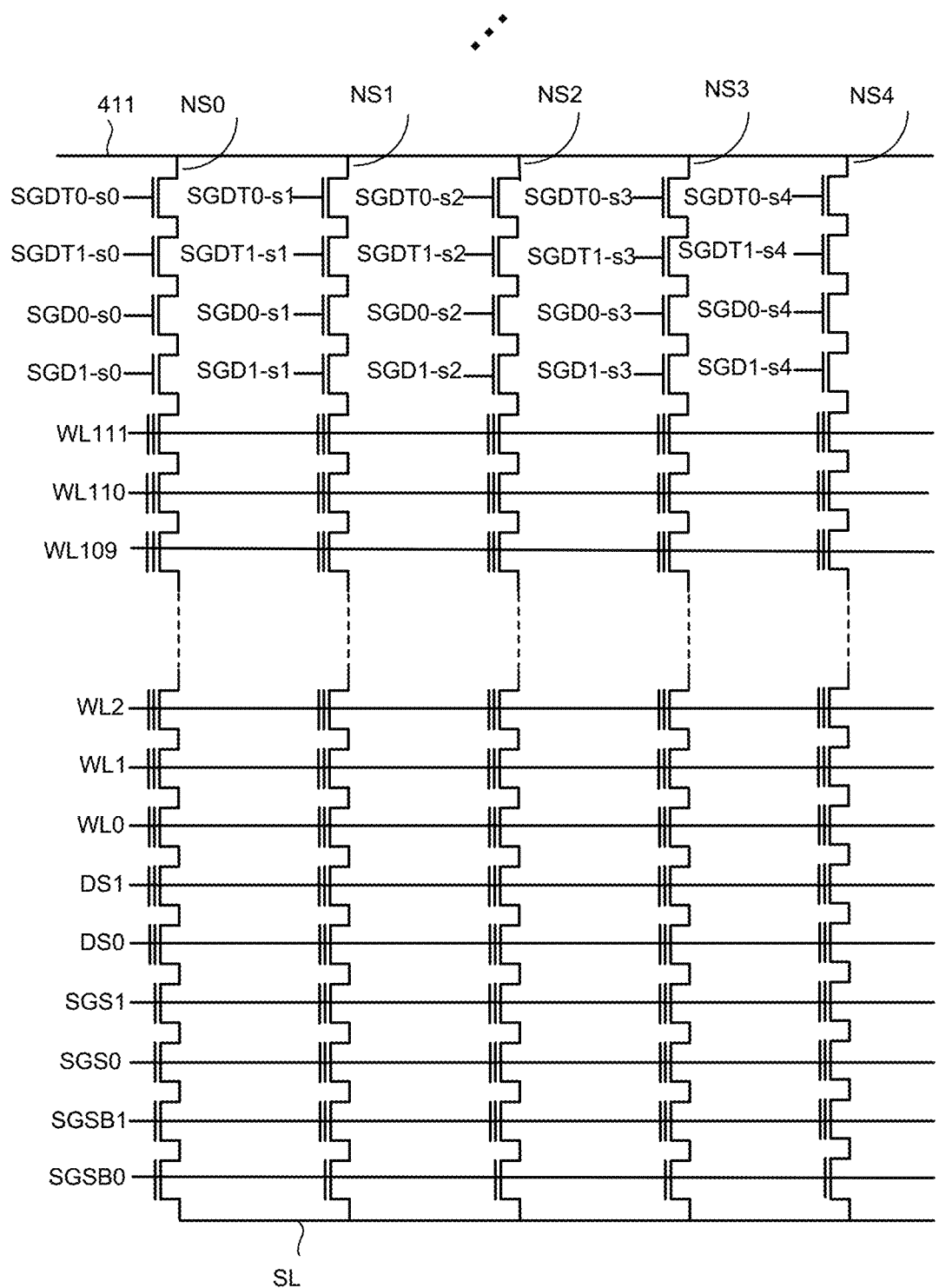
FIG. 4F is a schematic diagram of a portion of one embodiment of a block, depicting several NAND strings.

FIG. 4F is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the physical block. For example, the set of drain side select lines connected to NS0 include SGDT0-s0, SGDT1-s0, SGD0-s0, and SGD1-s0. The set of drain side select lines connected to NS1 include SGDT0-s1, SGDT1-s1, SGD0-s1, and SGD1-s1. The set of drain side select lines connected to NS2 include SGDT0-s2, SGDT1-s2, SGD0-s2, and SGD1-s2. The set of drain side select lines connected to NS3 include SGDT0-s3, SGDT1-s3, SGD0-s3, and SGD1-s3. The set of drain side select lines connected to NS4 include SGDT0-s4, SGDT1-s4, SGD0-s4, and SGD1-s4. Herein the term "SGD" may be used as a general term to refer to any one or more of the lines in a set of drain side select lines. In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-s0, SGDT1-s0, SGD0-s0, and SGD1-s0. A second sub-block corresponds to those vertical NAND strings controlled by SGDT0-s1, SGDT1-s1, SGD0-s1, and SGD1-s1. A third sub-block corresponds to those vertical NAND strings controlled by SGDT0-s2, SGDT1-s2, SGD0-s2, and SGD1-s2. A fourth sub-block corresponds to those vertical NAND strings controlled by SGDT0-s3, SGDT1-s3, SGD0-s3, and SGD1-s3. A fifth sub-block corresponds to those vertical NAND strings controlled by SGDT0-$4, SGDT1-s4, SGD0-s4, and SGD1-s4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase unit. For example, memory cells connected to WL0-WL55 may be in the lower tier 423 and memory cells connected to WL56-WL111 may be in the upper tier 421. Hence, memory cells connected to WL0-WL55 may be in one erase unit and memory cells connected to WL56-WL111 may be in another erase unit. A physical block could be operated in more than two tiers. Erase units can be formed based on other divisions of physical blocks.

Although the example memories of FIGS. 4, 4A, 4B, 4C, 4D and 4F are three dimensional memory structure that includes vertical NAND strings with charge-trapping material, other 3D memory structures can also be used with the technology described herein.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6A:
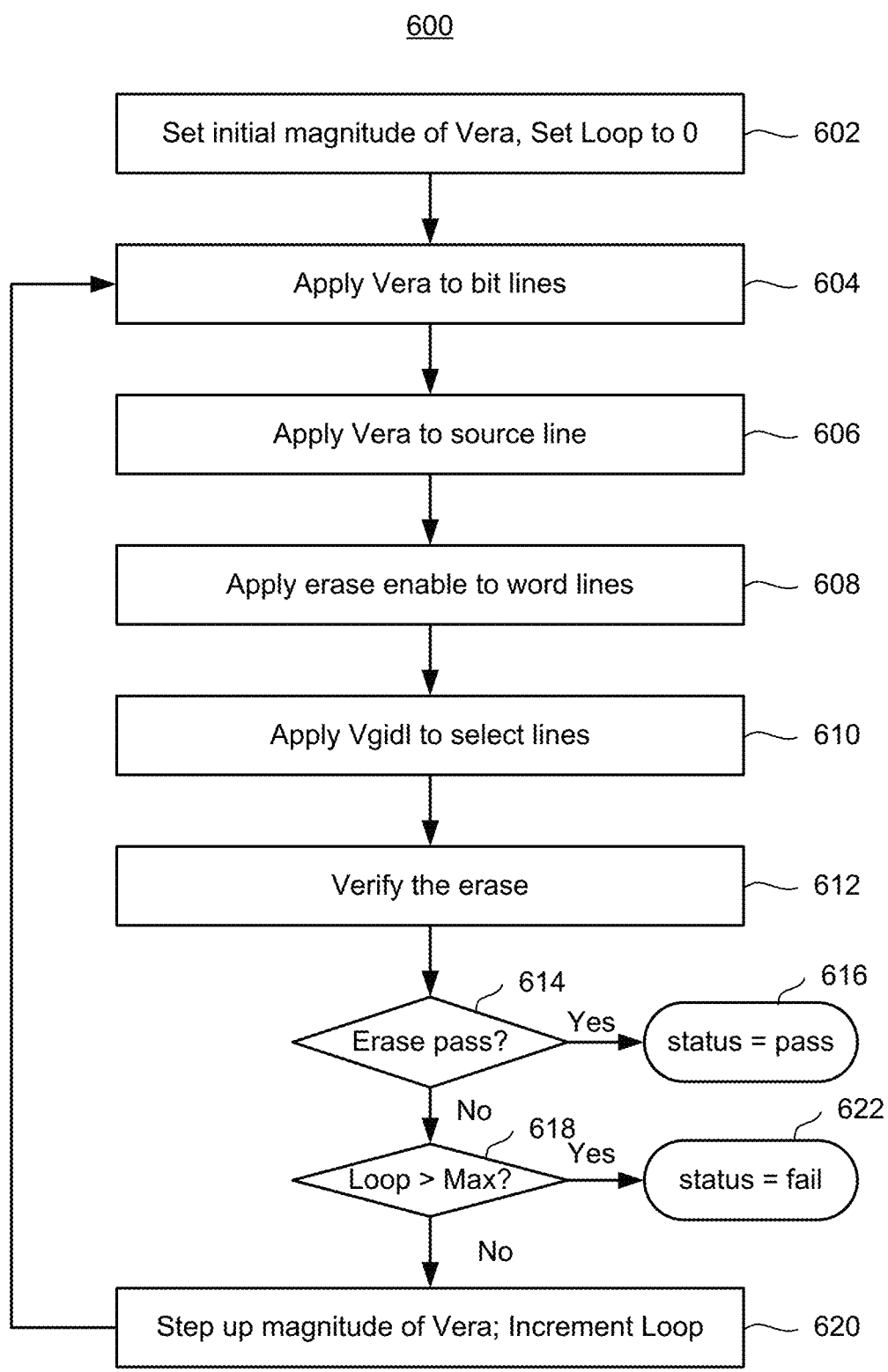
FIG. 6A is a flowchart describing one embodiment of a process for erasing memory cells from both a drain side and a source side.

FIG. 6A is a flowchart describing one embodiment of a process 600 for erasing memory cells. In an embodiment, circuitry on the die (200, 211) performs process 600 in response to a command from memory controller 120. The process 600 may be used to erase a group of NAND strings in a three-dimensional memory structure. In one embodiment, the process 600 may be used to erase an entire physical block of NAND memory cells. In one embodiment, the process 600 may be used to erase a sub-block of the physical block of NAND memory cells. One type of sub-block are the sub-blocks selected by different select lines such as in FIG. 4F. For example, the sub-block selected by SGD-s0 may be erased independent of the other four sub-blocks. Thus, in the example in FIG. 4F, there may be five sub-blocks selected by the respective SGDs. In an embodiment, system control logic 260 performs process 600 in response to a command from the memory controller 120. In one embodiment, process 600 is used for a normal erase. In one embodiment, process 600 is used during a test for a defect in the block. However, in some embodiments, different parameters are used when the process 600 is used to test for a defect.

Process 600 describes a double sided erase in which an erase voltage (Vera) is applied at both ends of NAND strings (e.g., bit lines and source line). The erase in process 600 is what is referred to herein as a gate induced drain leakage (GIDL) erase. A GIDL erase uses a GIDL current to charge up the NAND string channel. An erase enable voltage is applied to control gates of the memory cells, while maintaining the string channel potential to erase the memory cells. The GIDL current is generated by causing a drain-to-gate voltage at a select transistor (drain side and/or source side). The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel 465, thereby raising the potential of the channel 465. The other type of carriers, e.g., electrons, are extracted from the channel 465, in the direction of a bit line or in the direction of a source line, by an electric field. During erase, the holes may tunnel from the channel to a charge storage region 463 of memory cells and recombine with electrons there, to lower the threshold voltage of the memory cells. Thus, in an embodiment of two-sided GIDL erase holes are provided from both the drain side and the source side.

Step 602 includes setting an initial magnitude of an erase voltage (Vera). The initial Vera may have a relatively large magnitude such as, for example, 20V. Step 602 also includes setting a loop counter to 0. The loop counter will be used to track an allowed number of erase loops prior to ending process 600 in the event erase has not yet passed. Step 604 includes applying Vera to bit lines associated with the group of NAND strings being erased. Step 606 includes applying Vera to one or more source lines associated with the group of NAND strings being erased. As noted above, when process 600 is used to test for a defect different parameters could be used. In one embodiment, the duration of the erase pulse for Vera is shorter when process 600 is used to test for a defect than the erase pulse used for a normal erase.

Step 608 includes applying an erase enable voltage to the word lines connected to the group of NAND strings being erased. In one embodiment, the erase enable voltage is 0V but could be other than 0V such as about 0.5V. Step 610 includes applying a GIDL voltage to select lines (e.g., SGD, SGS). The GIDL voltage results in a GIDL current as described above. Also, the GIDL voltage allows Vera to pass to the NAND channels. Thus, the GIDL voltage (Vgidl) is a voltage that has a suitable magnitude to result in a GIDL current. In one embodiment, the GIDL voltage is about 12V less than Vera. As noted above, when process 600 is used to test for a defect different parameters could be used. In one embodiment, the magnitude of Vgidl is lower when process 600 is used to test for a defect compared to when process 600 is used for a normal erase. Using a lower magnitude of Vgidl can increase the E-field between the drain to gate (bit line to SGD).

Thus, the erase of a memory cell includes applying an erase enable voltage (e.g., 0V) to the control gate of the memory cell while applying an erase voltage (e.g., about 20V) to a channel or body of the memory cell. An erase voltage is defined herein as a voltage applied to a channel or body of a memory cell that will erase the memory cell providing that the erase enable voltage is also applied to a control gate of that memory cell. A memory cell that has the erase voltage applied to its channel (body) may be inhibited from erase by applying an erase inhibit voltage (e.g., the erase voltage or about 20V, but the erase inhibit voltage could have a lower magnitude) to its control gate. An erase inhibit voltage is defined herein as a voltage that will inhibit erase of a memory cell despite the erase voltage being applied to a channel of that memory cell.

After steps 604-610 are performed, an erase verify may be performed in step 612. The erase verify may apply for example VeV (See FIG. 5A or 5B) to each data WL connected to the group of NAND strings being erased. If all memory cells on a given NAND string have a Vt below VeV then the NAND string will conduct a significant current. Step 614 is a determination of whether erase is complete. In an embodiment, the storage system 100 will count the number of NAND strings that have not yet passed erase. In an embodiment, if the number is below an allowed number, then the erase is allowed to pass. If erase has passed then the process 600 completes with a status of pass in step 616. If erase has not yet passed then a determination may be made in step 618 of whether the loop counter has exceeded the maximum. In one embodiment, the erase process is allowed a certain number of loops to complete. If the loop count is greater than the maximum then the process ends with a status of fail in step 622. If the loop count is not greater than the maximum then the process continues at step 620. In step 620, the magnitude of the erase voltage may optionally be increased. Also, the loop count is incremented. Then steps 604-618 are repeated.

Figure 6B:
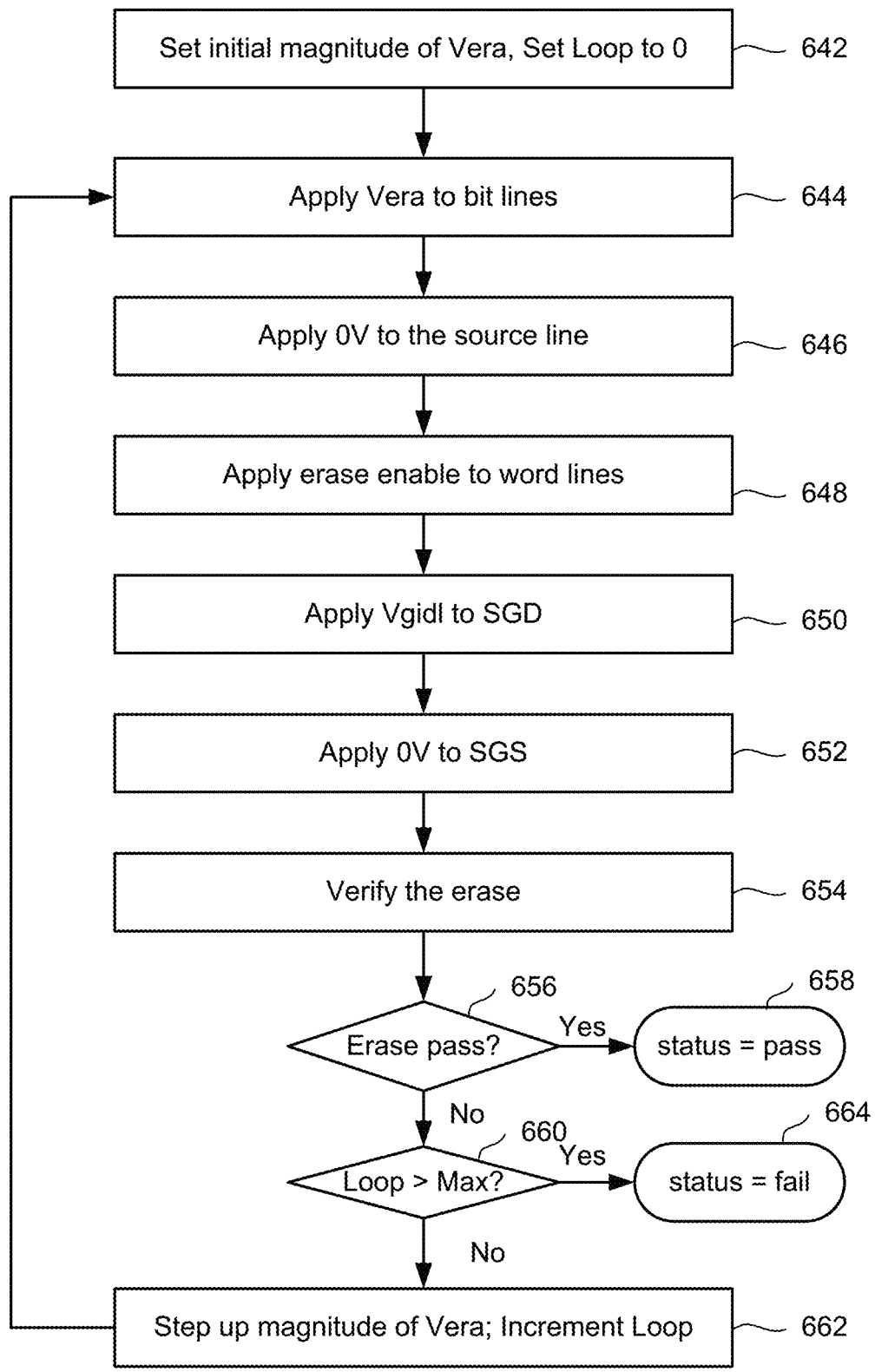
FIG. 6B is a flowchart of one embodiment of a process of drain-side Gate-Induced-Drain-Leakage (GIDL) erase.

Whereas process 600 in FIG. 6A is for a two-sided GIDL erase, one-sided GIDL erases are also possible. FIG. 6B is a flowchart of one embodiment of a process 640 of drain-side GIDL erase. The drain-side GIDL erase is one example of a one-sided erase. The process 640 is similar to process 600 except that the GIDL current is only generated at the drain end of the NAND strings. Thus, in an embodiment of drain-side GIDL erase holes are provided from the drain side but not from the source side. In an embodiment, circuitry on the die (200, 211) performs process 640 in response to a command from memory controller 120. Step 642 includes setting an initial magnitude of an erase voltage (Vera). Step 644 includes applying Vera to bit lines associated with the group of NAND strings being erased. Step 646 includes applying 0V to one or more source lines associated with the group of NAND strings being erased. Step 648 includes applying an erase enable voltage to the word lines connected to the group of NAND strings being erased. Step 650 includes applying a GIDL voltage to the drain side select lines (e.g., SGD). Step 652 includes applying 0V to the source side select lines (SGS).

After steps 644-652 are performed, an erase verify may be performed in step 654. Step 656 is a determination of whether erase is complete. If erase has passed then the process 640 completes with a status of pass in step 658. If erase has not yet passed then a determination may be made in step 660 of whether the loop counter has exceeded the maximum. In one embodiment, the erase process is allowed a certain number of loops to complete. If the loop count is greater than the maximum then the process ends with a status of fail in step 664. If the loop count is not greater than the maximum then the process continues at step 662. In step 662, the magnitude of the erase voltage may optionally be increased. Also, the loop count is incremented. Then steps 644-660 are repeated.

Figure 6C:
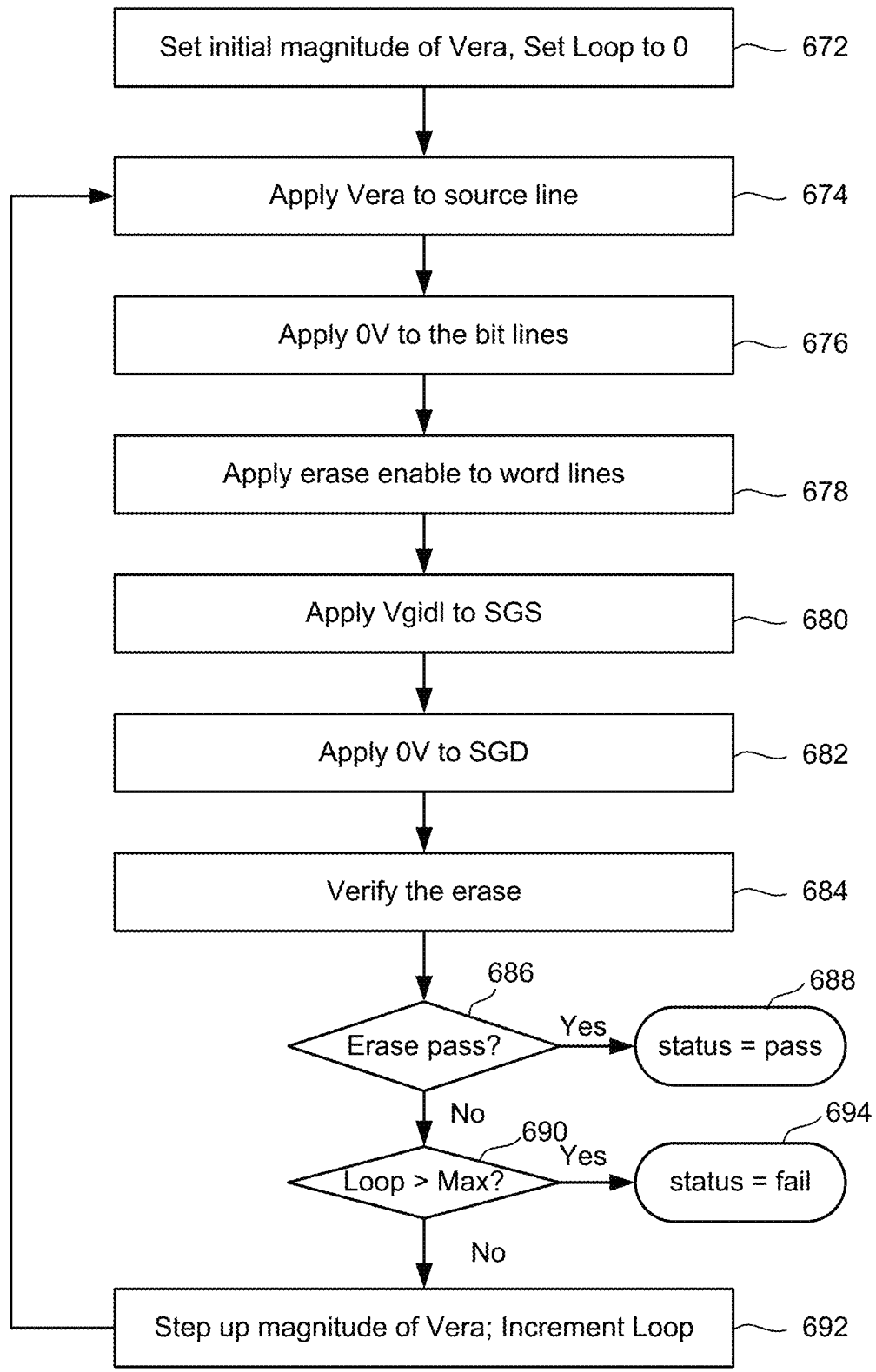
FIG. 6C is a flowchart of one embodiment of a process of source-side GIDL erase

FIG. 6C is a flowchart of one embodiment of a process 670 of source-side GIDL erase. The source-side GIDL erase is one example of a one-sided erase. The process 670 is similar to process 600 except that the GIDL current is only generated at the source end of the NAND strings. Thus, in an embodiment of source-side GIDL erase holes are provided from the source side but not from the drain side. In an embodiment, circuitry on the die (200, 211) performs process 670 in response to a command from memory controller 120. Step 672 includes setting an initial magnitude of an erase voltage (Vera). Step 674 includes applying Vera to the source line(s) associated with the group of NAND strings being erased. Step 676 includes applying 0V to the bit lines associated with the group of NAND strings being erased. Step 678 includes applying an erase enable voltage to the word lines connected to the group of NAND strings being erased. Step 680 includes applying a GIDL voltage to the source side select lines (e.g., SGS). Step 682 includes applying 0V to the drain side select lines (SGS).

After steps 674-682 are performed, an erase verify may be performed in step 684. Step 686 is a determination of whether erase is complete. If erase has passed then the process 670 completes with a status of pass in step 688. If erase has not yet passed then a determination may be made in step 690 of whether the loop counter has exceeded the maximum. In one embodiment, the erase process is allowed a certain number of loops to complete. If the loop count is greater than the maximum then the process ends with a status of fail in step 694. If the loop count is not greater than the maximum then the process continues at step 692. In step 692, the magnitude of the erase voltage may optionally be increased. Also, the loop count is incremented. Then steps 674-690 are repeated.

Figure 7:
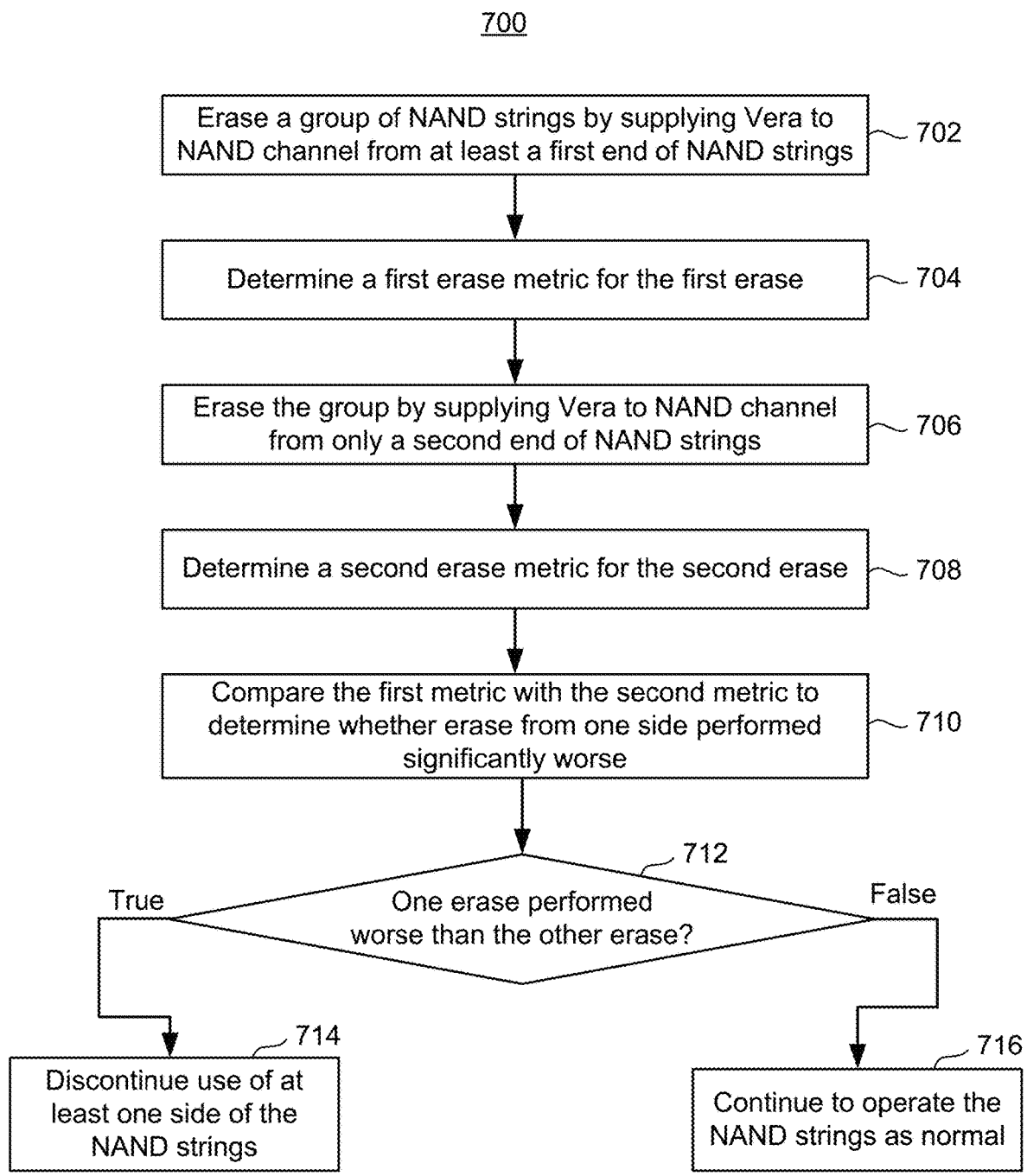
FIG. 7 is a flowchart of one embodiment of a process of testing a group of NAND strings for an evolving defect.

FIG. 7 is a flowchart of one embodiment of a process 700 of testing a group of NAND strings for an evolving defect. In an embodiment, the group of NAND strings resides in a block. In one embodiment, the group includes all of the NAND strings in the block. In one embodiment, the group is only a portion of the NAND strings such as a sub-block selected by an SGD. The group of NAND strings has a drain end adjacent to the bit lines and a source end adjacent to the source line(s). The process 700 is typically only performed on the block occasionally, such as after a significant number program/erase cycles. Also note that the block could undergo a normal erase prior to process 700, followed by programming in a test pattern.

Step 702 includes erasing the group of NAND strings by applying an erase voltage (e.g., Vera) from at least a first end of the NAND strings. In one embodiment, this is a one-sided erase from the drain end. In one embodiment, this is a one-sided erase from the source side. In one embodiment, this is a two-sided erase from both the drain end and the source end. Thus, any of process 600 (FIG. 6A), process 640 (FIG. 6B), or process 670 (FIG. 6C) may be used (however, step 702 is not limited to these erase procedures). In an embodiment of step 702 holes are provided from the drain side. In an embodiment of step 702 holes are provided from the source side. In an embodiment of step 702 holes are provided from the drain side and the source side.

Step 704 includes determining a first erase metric for this erase of step 702. The first erase metric might include, but is not limited to, a pass/fail status or a number of erase pulses (or erase loops) needed to pass erase.

Step 706 includes erasing the group of NAND strings by applying an erase voltage (e.g., Vera) from only the second end of the NAND strings. Note that between steps 704 and 706 the test pattern may again be programmed into the block. If step 702 performed a one-sided erase from the drain end then step 706 includes a one-sided erase from the source end. If step 702 performed a one-sided erase from the source end then step 706 includes a one-sided erase from the drain end. In one embodiment if step 702 performed a two-sided erase then step 706 includes a one-sided erase from the source end. In one embodiment if step 702 performed a two-sided erase then step 706 includes a one-sided erase from the drain end. Note that in an embodiment, similar erase parameters are used in the first erase and the second erase. In an embodiment, the first and second eras use the same magnitude and duration of Vera, and also use the same Vgidl (magnitude and duration).

Step 708 includes determining a second erase metric for the erase of step 706. The second erase metric might include, but is not limited to, a pass/fail status or a number of erase pulses (or erase loops) needed to pass erase.

Step 710 includes a comparison of the first metric with the second metric to determine of whether one erase performed worse than the other erase. One embodiment step 710 includes a determination of whether one erase passed and the other erase failed. One embodiment step 710 includes a determination of whether one erase took more erase pulses to perform than the other erase. The test could also be whether one erase took two more, three more, of some other number of erase pulses more than the other erase to complete.

If the condition (step 712) is true then the system discontinues using at least one side of the NAND strings (step 714). In one embodiment, the entire block or sub-block is no longer used. However, another option is to identify what regions of the NAND strings are defective and what regions are still functional. For example, if a drain-side erase passes but the source-side erase fails this can indicate a defect in the source end of the block (or sub-block). In this case, the system could discontinue use of the defective region in the source end while continuing to use the functional regions of the block.

If the condition (step 712) is false then the system continues to use the group of NAND strings (step 716). In an embodiment, circuitry on the die (200, 211) performs at least some of the steps in process 700 in response to a command from memory controller 120. For example, the memory controller 120 may instruct the circuitry on the die (200, 211) to perform the erases in step 702 and 706. Other steps could be performed by the memory controller, the circuitry on the die (200, 211), or a combination of the memory controller and the circuitry on the die (200, 211).

FIG. 8 is a flowchart of one embodiment of a process 800 of testing a group of NAND strings for an evolving defect. In one embodiment, the process 800 will test for a defect at the source end of the NAND strings. One example is a defect due to ST bending, but the defect may arise (or evolve) for other reasons. The evolving defect may include a MH-WL short, a MH-SGS short, but is not limited thereto. In an embodiment, the group of NAND strings under test resides in a block. In one embodiment, the group includes all of the NAND strings in the block. Process 800 is described as testing the entire block. However, in one embodiment, the group under test is only a portion of the NAND strings such as a sub-block selected by an SGD. In an embodiment the process 800 is only performed occasionally such as after a number of program/erase cycles. In one embodiment, prior to process 800 a normal erase is performed and then a test pattern is programmed into the block. Process 800 provides further details for one embodiment of process 700 in FIG. 7.

Step 802 includes erasing the group of NAND strings by applying an erase voltage (e.g., Vera) from at least the bit lines. In one embodiment, this is a one-sided erase from the drain end in which Vera is applied to the bit lines and Vgidl is applied to SGD. In one embodiment, this is a two-sided erase from both the drain end and the source end. In the two-sides erase Vera is applied to the bit lines and the source line(s) and Vgidl is applied to SGD and SGS.

Step 804 includes determining a first erase metric for this erase of step 802. The first erase metric might include, but is not limited to, a pass/fail status or a number of erase pulses (or erase loops) needed to pass erase.

Step 806 includes erasing the group of NAND strings by applying an erase voltage (e.g., Vera) from only the source line(s). This is a one-sided erase from the source end in which Vera is applied to the source line(s) and Vgidl is applied to SGS. Note that between step 804 and 806 a test pattern may be programmed into the group of NAND strings. Note that in an embodiment, similar erase parameters are used in the first erase and the second erase. In an embodiment, the drain side and source use the same magnitude and duration of Vera, and also use the same Vgidl (magnitude and duration).

Step 808 includes determining a second erase metric for the erase of step 806. The second erase metric might include, but is not limited to, a pass/fail status or a number of erase pulses (or erase loops) needed to pass erase.

Step 810 includes a comparison of the first erase metric with the second erase metric to determine whether the erase from the source line(s) performed significantly worse than the erase from the bit lines. One embodiment step 810 includes a determination of whether the erase with Vera from the bit lines passed but the erase with Vera from the source line(s) failed. One embodiment step 810 includes a determination of whether the source side erase took at least "n" additional erase pulses to complete than the drain side erase, where n is a positive integer.

Step 812 includes a determination of whether the source side erase performed worse than the drain side erase (based on the erase metrics). If the test of step 812 is true then the system discontinues using at least a portion of the block (step 814). In one embodiment, the entire block is no longer used. However, another option is to identify what regions of the block is defective and what regions are still functional.

For example, the system could discontinue use of a defective region in the source end while continuing to use the functional regions of the block. If the test of step 812 is false then the system continues to use the block as normal (step 816).

In an embodiment, circuitry on the die (200, 211) performs at least some of the steps in process 800 in response to a command from memory controller 120. For example, the memory controller 120 may instruct the circuitry on the die (200, 211) to perform the erases in step 802 and 806. Other steps could be performed by the memory controller, the circuitry on the die (200, 211), or a combination of the memory controller and the circuitry on the die (200, 211).

FIG. 9 is a flowchart of one embodiment of a process 900 of operating a block of NAND strings in connection with a normal erase. The normal erase is performed as part of a program/erase cycling. Step 902 includes performing a normal erase of the block. In one embodiment, the two-sided GIDL erase of process 600 in FIG. 6 is performed. However, a one sided GIDL erase could be performed. Also, the erase is not required to be a GIDL erase.

Step 904 is a determination of whether a program/erase (P/E) cycle count is met. If the count is met then the block is tested for a defect by continuing on at step 906. The system may test the block on a schedule that is based on the P/E count. The schedule could be every "x" cycles such as every 500 cycles. However, it is not required that the testing be at regular (or periodic) intervals. In one embodiment, the frequency of testing depends on temperature. The system may record the temperature at which the block is used then the frequency of testing be increased. Also, the frequency of testing could change over time even without considering temperature. As will be explained in more detail below, the frequency of testing may be changed in response to an outcome of testing for a defect. If the system determines that the block is not to be tested at this time then the process ends.

Continuing the discussion at step 906, the system programs a test pattern into the block. The test pattern may be any suitable test pattern. One example test pattern is a random pattern. However, the test pattern is not required to be random data. The test pattern could be SLC or MLC. If MLC the pattern could be one, two, three, four, or some other number of bits per cell. Step 908 includes erasing the block by supplying Vera to the NAND channels from at least the bit lines. In one embodiment, a two-sided GIDL erase is performed, such as described in process 600 of FIG. 6A. In one embodiment, a one-sided drain side GIDL erase is performed, such as described in process 640 of FIG. 6B. Step 908 may also include storing a first metric for this erase. The first metric may include a pass/fail status, a number of erase pulses to complete erase, etc.

Continuing the discussion at step 910, the system again programs the test pattern into the block. This should be the same test pattern as was used in step 906. Note that one option is to perform a normal erase prior to step 910 to assure that the block has been fully erased following the erase of step 908. Step 912 includes erasing the block by supplying Vera to the NAND channels from only the source line(s). In one embodiment, a one-sided source side GIDL erase is performed, such as described in process 670 of FIG. 6C. Note that in an embodiment, similar erase parameters are used in the first erase and the second erase. In an embodiment, the drain side erase and source erase use the same magnitude and duration of Vera, and also use the same Vgidl (magnitude and duration). Step 912 may also include storing a second metric for this erase. The second metric may include a pass/fail status, a number of erase pulses to complete erase, etc.

Step 914 includes a determination of whether the source side only erase (step 912) performed worse than the erase from the bit line side (step 908). If the source side only erase performed worse, then step 916 includes discontinuing use of at least a portion of the block. Thus, the system determines that there is a defect in the block as a response of the test outcome. The system may mark the entire block as not for use or may identity what portions are suitable for use and use only a portion of the block. In one embodiment, such partial blocks are reserved for system use (not for user data). If the source side only erase did not perform worse, then step 918 includes continuing use of the block as normal.

In an embodiment, circuitry on the die (200, 211) performs at least some of the steps in process 800 in response to a command from memory controller 120. For example, the memory controller 120 may instruct the circuitry on the die (200, 211) to perform the erases in step 902, 908 and 912. The memory controller 120 may also instruct the circuitry on the die (200, 211) to program the test patterns. Other steps could be performed by the memory controller, the circuitry on the die (200, 211), or a combination of the memory controller and the circuitry on the die (200, 211).

In one embodiment, the determination of whether the source-side erase performs worse than the drain-side erase is based on pass/failure status. FIG. 10 is a flowchart of one embodiment of a process 1000 of testing for a defect in which the determination of whether the source-side erase performed worse than the drain-side erase is based on pass/failure status. Step 1002 includes erasing the block by supplying Vera to the NAND channels from at least the bit lines. In one embodiment, a one-sided drain side GIDL erase is performed, such as described in process 640 of FIG. 6B. In one embodiment, a two-sided drain side GIDL erase is performed, such as described in process 600 of FIG. 6A. Note that prior to steps 1002 and 1006 a test pattern could be programmed into the block. Step 1004 includes a determination of whether the drain side erase passed. If the drain side erase failed then the test may end. Note that the erase of process 1000 may be given fewer erase pulses to complete than a normal erase. If the drain side erase passed than the block is erased by supplying Vera to the NAND channels from only the source line(s).

Step 1006 includes erasing the block by supplying Vera to the NAND channels from only the source line(s). In one embodiment, a one-sided source side GIDL erase is performed, such as described in process 670 of FIG. 6C. Note that in an embodiment, similar erase parameters are used in the first erase and the second erase. In an embodiment, the drain side erase and source erase use the same magnitude and duration of Vera, and also use the same Vgidl (magnitude and duration). Step 1008 includes a determination of whether the source side erase passed. If the source side erase failed then this indicates a defect in the block. Step 1010 includes to discontinue use of at least a portion of the block. If the source side erase passed then step 1012 includes to continuing use the block as normal.

In an embodiment, circuitry on the die (200, 211) performs at least some of the steps in process 1000 in response to a command from memory controller 120. For example, the memory controller 120 may instruct the circuitry on the die (200, 211) to perform the erases in step 1002 and 1006. Other steps could be performed by the memory controller, the circuitry on the die (200, 211), or a combination of the memory controller and the circuitry on the die (200, 211).

In one embodiment, the determination of whether the source-side erase performed worse than the drain-side erase is based on a number or erase pulses needed to complete erase. FIG. 11 is a flowchart of one embodiment of a process 1100 of testing for a defect in which the determination of whether the source-side erase performed worse than the drain-side erase is based on a number or erase pulses needed to complete erase. Step 1102 includes erasing the block by supplying Vera to the NAND channels from at least the bit lines. In one embodiment, a one-sided drain side GIDL erase is performed, such as described in process 640 of FIG. 6B. In one embodiment, a two-sided drain side GIDL erase is performed, such as described in process 600 of FIG. 6A. Step 1104 includes recording the number of erase pulses needed to pass for the drain side erase (ELD).

Step 1106 includes erasing the block by supplying Vera to the NAND channels from only the source line(s). In one embodiment, a one-sided source side GIDL erase is performed, such as described in process 670 of FIG. 6C. Note that in an embodiment, similar erase parameters are used in the first erase and the second erase. In an embodiment, the drain side erase and source erase use the same magnitude and duration of Vera, and also use the same Vgidl (magnitude and duration). Step 1108 includes recording the number of erase pulses needed to pass for the source side erase (ELS). Note that prior to steps 1102 and 1106 a test pattern could be programmed into the block.

Step 1110 is a determination of whether the source side erase took T or more erase pulses (e.g., more erase loops) to complete than the drain side erase (ELS−ELD≥T?), wherein T is a positive integer. In one embodiment, T is 1. However, T could be another positive integer. If ELS−ELD≥T, then step 1112 includes a determination that a defect is detected. Moreover, an assumption may be made that the defect is at the source side of the block. Step 1112 may also include discontinuing use of at least a portion of the block as has been described above. If the source side erase did not take T or more erase pulses to complete than the drain side erase then step 1114 includes continuing to use the block as normal (no defect).

In an embodiment, circuitry on the die (200, 211) performs at least some of the steps in process 1000 in response to a command from memory controller 120. For example, the memory controller 120 may instruct the circuitry on the die (200, 211) to perform the erases in step 1102 and 1106. Other steps could be performed by the memory controller, the circuitry on the die (200, 211), or a combination of the memory controller and the circuitry on the die (200, 211).

In view of the foregoing, an embodiment includes an apparatus comprising a three-dimensional memory structure comprising NAND strings. The three-dimensional memory structure having bit lines associated with drain ends of the NAND strings and source lines associated with source ends of the NAND strings. The apparatus has one or more control circuits in communication with the three-dimensional memory structure. The one or more control circuits are configured to perform a first erase of a group of NAND strings with an erase voltage provided from at least a first end of the group of NAND strings. The one or more control circuits are configured to perform a second erase of the group of NAND strings with an erase voltage provided from a second end of the group of NAND strings but not from the first end. The one or more control circuits are configured to determine that the group of NAND strings has a defect in response to the second erase performing significantly worse than the first erase.

In a further embodiment, the second erase performing significantly worse than the first erase includes the second erase failing and the first erase passing.

In a further embodiment, the second erase performing significantly worse than the first erase includes the second erase taking at least a pre-determined number of erase pulses more to complete than the first erase.

In a further embodiment, the one or more control circuits are further configured to discontinue use of the group of NAND strings in response to determining that the group of NAND strings has the defect.

In a further embodiment, the one or more control circuits are further configured to operate the group of NAND strings at partial capacity in response to determining that the group of NAND strings has the defect.

In a further embodiment, the one or more control circuits are further configured to identify a region in the group of NAND strings adjacent to the source ends as defective in response to the second erase performing significantly worse than the first erase.

In a further embodiment, the one or more control circuits are further configured to test the group of NAND strings for the defect in a schedule based on program/erase cycles.

In a further embodiment, the one or more control circuits are further configured to compare a first number of erase pulses needed to complete the first erase with a second number of erase pulses needed to complete the second erase. And the one or more control circuits are further configured to increase a frequency at which the group of NAND strings is tested for the defect in response to the second number of erase pulses being at least a pre-determined number more than the first number of erase pulses.

In a further embodiment, the first erase includes a drain side gate induced drain leakage (GIDL) erase with the erase voltage provided from bit lines associated with the group of NAND strings but not from one or more source lines associated with the group of NAND strings. The second erase includes a source side GIDL erase with the erase voltage provided from the one or more source lines associated with the group of NAND strings but not from the bit lines associated with the group of NAND strings.

In a further embodiment, the first erase includes a two-sided gate induced drain leakage (GIDL) erase with the erase voltage provided from both bit lines associated with the group of NAND strings and from one or more source lines associated with the group of NAND strings. The second erase includes a one-sided GIDL erase with the erase voltage provided from the one or more source lines associated with the group of NAND strings but not from the bit lines associated with the group of NAND strings.

One embodiment includes a method for detecting evolving bad blocks in three-dimensional NAND. The method comprising programming a test pattern into a block of NAND strings after a pre-determined number of program/erase cycles of the block. The method comprises erasing the test pattern in the block with a drain side Gate-Induced-Drain-Leakage (GIDL) erase that provides an erase voltage from a drain end of the NAND strings. The method comprises determining a first metric of quality of the drain side GIDL erase. The method comprises programming the test pattern into the block of NAND strings after erasing the block with the drain side GIDL erase. The method comprises erasing the test pattern in the block of NAND strings with a source side GIDL erase that provides an erase voltage from a source end of the NAND strings but not from the drain end of the NAND strings. The method comprises determining a second metric of quality of the source side GIDL erase. The method comprises comparing the first metric and with the second metric to determine whether the source side GIDL erase performed worse than the drain side GIDL erase. The method comprises determining that the block of NAND strings has a defect in response to determining that the source side GIDL erase performed worse than the drain side GIDL erase.

One embodiment includes a non-volatile storage system. The system comprises a three-dimensional (3D) memory structure comprising block, each block having NAND strings, word lines and one or more source lines. The three-dimensional memory structure has bit lines associated with the blocks. The system comprises one or more control circuits in communication with the three-dimensional memory structure. The one or more control circuits are configured to perform a first Gate-Induced-Drain-Leakage (GIDL) erase of a block in the 3D memory structure in which an erase voltage is provided from at least from the bit lines. The one or more control circuits are configured to determine a first metric for the first GIDL erase of the block. The one or more control circuits are configured to perform a second GIDL erase of the block in which an erase voltage is provided from at least the one or more source lines of the block but not from the bit lines. The one or more control circuits are configured to determine a second metric for the second GIDL erase of the block. The one or more control circuits are configured to determine whether the second GIDL erase performed worse than the first GIDL erase based on a comparison of the first metric with the second metric. The one or more control circuits are configured to discontinue use of at least a source side portion of the block in response to the second GIDL erase performing worse than the first GIDL erase.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
    a three-dimensional memory structure comprising NAND strings having drain ends and source ends, the three-dimensional memory structure having bit lines associated with the drain ends of the NAND strings and source lines associated with the source ends of the NAND strings, either the drain ends or the source ends being first ends of the NAND strings with the other of the drain ends or the source ends being second ends of the NAND strings; and
    one or more control circuits in communication with the three-dimensional memory structure, wherein the one or more control circuits are configured to:
        initiate a defect test of a group of NAND strings;
        perform a first erase of the group of NAND strings during the defect test with an erase voltage pulses supplied to NAND channels from at least the first ends of the group of NAND strings, including record a first number of erase voltage pulses for the first erase of the group of NAND strings to pass;
        perform a second erase of the group of NAND strings during the defect test with erase voltage pulses supplied to the NAND channels from the second ends of the group of NAND strings but not from the first ends, including record a second number of erase voltage pulses for the second erase of the group of NAND strings to pass; and
        determine that the group of NAND strings has a defect in response to the second number of erase voltage pulses being at least a threshold number greater than the first number of erase voltage pulses.

2. The apparatus of claim 1, wherein the one or more control circuits are further configured to:
    discontinue use of the group of NAND strings in response to determining that the group of NAND strings has the defect.

3. The apparatus of claim 1, wherein the one or more control circuits are further configured to:
    operate the group of NAND strings at partial capacity in response to determining that the group of NAND strings has the defect.

4. The apparatus of claim 1, wherein the one or more control circuits are further configured to identify a region in the group of NAND strings adjacent to the second ends as defective in response to the second number of erase voltage pulses being at least the threshold number greater than the first number of erase voltage pulses.

5. The apparatus of claim 1, wherein the one or more control circuits are further configured to:
    initiate the defect test of the group of NAND strings for the defect in a schedule based on program/erase cycles.

6. The apparatus of claim 5, wherein the one or more control circuits are further configured to:
    increase a frequency at which the group of NAND strings is tested for the defect in response to the second number of erase voltage pulses being at least a pre-determined number more than the first number of erase voltage pulses, the pre-determined number being less than the threshold number.

7. The apparatus of claim 5, wherein:
    the first erase includes a drain side gate induced drain leakage (GIDL) erase with the erase voltage pulses applied to bit lines associated with the group of NAND strings but not to any source lines associated with the group of NAND strings; and the second erase includes a source side GIDL erase with the erase voltage pulses applied to all source lines associated with the group of NAND strings but not to the bit lines associated with the group of NAND strings.

8. The apparatus of claim 1, wherein:

the first erase includes a two-sided gate induced drain leakage (GIDL) erase with the erase voltage pulses applied to both bit lines associated with the group of NAND strings and to all the source lines associated with the group of NAND strings; and the second erase includes a one-sided GIDL erase with the erase voltage pulses applied to all the source lines associated with the group of NAND strings but not to the bit lines associated with the group of NAND strings.

9. A method for detecting evolving bad blocks in three-dimensional NAND, the method comprising:

initiating a defect test of a block of NAND strings in response to a pre-determined number of program/erase cycles of the block being reached;

programming a first test pattern into the block of NAND strings during the defect test;

erasing the first test pattern in the block during the defect test with a drain side Gate-Induced-Drain-Leakage (GIDL) erase that includes applying an-erase voltage pulses to bit lines connected to a drain end of the NAND strings;

recording a first number of erase voltage pulses for the drain side GIDL erase of the block of NAND strings to pass;

programming a second test pattern into the block of NAND strings during the defect test, wherein the second test pattern is the same as the first test pattern;

erasing the second test pattern in the block during the defect test with a source side GIDL erase that includes applying erase voltage pulses to a source line connected to a source end of the NAND strings but not to the bit lines connected to the drain end of the NAND strings;

recording a second number of erase voltage pulses for the source side GIDL erase of the block of NAND strings to pass;

comparing the first number of erase voltage pulses and with the second number of erase voltage pulses; and determining that the block of NAND strings has a defect in response to the second number of erase voltage pulses being at least a threshold number greater than the first number of erase voltage pulses.

10. The method of claim 9, further comprising:

decreasing the pre-determined number of program/erase cycles in response to the second number of erase voltage pulses being at least a pre-determined number of erase voltage pulses more than the first number of erase pulses, the pre-determined number being less than the threshold number.

11. A non-volatile storage system, the system comprising:

a three-dimensional (3D) memory structure comprising blocks, each block having NAND strings, word lines and one or more source lines, the three-dimensional memory structure having bit lines associated with the blocks; and one or more control circuits in communication with the three-dimensional memory structure, wherein the one or more control circuits are configured to:

initiate a defect test of a selected block in the 3D memory structure;

perform a first Gate-Induced-Drain-Leakage (GIDL) erase of the block in the 3D memory structure during the defect test in which erase voltage pulses are provided from the bit lines;

determine a first number of erase voltage pulses for the first GIDL erase of the selected block to successfully complete;

perform a second GIDL erase of the selected block during the defect test in which erase voltage pulses are provided from the one or more source lines of the selected block but not from the bit lines;

determine a second number of erase voltage pulses for the second GIDL erase of the block to successfully complete; and discontinue use of at least a source side portion of the selected block in response to the second number of erase voltage pulses being at least a threshold number more than the first number of erase voltage pulses.

12. A non-volatile storage system of claim 11, wherein the one or more control circuits are configured to:

identify the source side portion of the selected block as defective in response to the second number of erase voltage pulses being at least the threshold number more than the first number of erase voltage pulses; and discontinue use of the defective source side portion of the selected block and continue to use other portions of the selected block.

13. A non-volatile storage system of claim 11, wherein the one or more control circuits are configured to:

discontinue use of the entire selected block in response to the second number of erase voltage pulses being at least the threshold number more than the first number of erase voltage pulse.

14. The non-volatile storage system of claim 11, wherein:

the first GIDL erase includes a drain side gate induced drain leakage (GIDL) erase with the erase voltage pulses provided from the bit lines but not from the one or more source lines of the selected block; and the second GIDL erase includes a source side GIDL erase with the erase voltage pulses provided from the one or more source lines of the selected block but not from the bit lines.

15. The non-volatile storage system of claim 11, wherein:

the first GIDL erase includes a two-sided gate induced drain leakage (GIDL) erase with the erase voltage pulses provided from both the bit lines and from the one or more source lines of the selected block; and the second GIDL erase includes a one-sided GIDL erase with the erase voltage pulses provided from the one or more source lines of the selected block but not from the bit lines.

16. The non-volatile storage system of claim 11, wherein the one or more control circuits are configured to:

perform the first GIDL erase and the second GIDL erase on a schedule based on a number of program/erase cycles of the selected block; and increase a frequency with which the first GIDL erase and the second GIDL erase are performed in response to the second number of erase voltage pulses being greater than the first number of erase voltage pulses by a predetermined number that is less than the threshold number.

17. The non-volatile storage system of claim 11, wherein the one or more control circuits are further configured to:

apply an erase enable voltage to all data word lines in the selected block while providing each of the erase voltage pulses from the bit lines during the first GIDL erase; and apply the erase enable voltage to all data word lines in the selected block while providing each of the erase voltage pulses from the bit lines during the second GIDL erase.

* * * * *